(12) United States Patent
Surendran et al.

(10) Patent No.: US 11,615,052 B1
(45) Date of Patent: Mar. 28, 2023

(54) PACKET IDENTIFICATION (ID) ASSIGNMENT FOR ROUTING NETWORK

(71) Applicant: Xilinx, Inc., San Jose, CA (US)

(72) Inventors: Rishi Surendran, San Jose, CA (US); Akella Sastry, San Jose, CA (US); Abnikant Singh, Hyderabad (IN)

(73) Assignee: XILINX, INC., San Jose, CA (US)

(*) Notice: Subject to any disclaimer, the term of this patent is extended or adjusted under 35 U.S.C. 154(b) by 880 days.

(21) Appl. No.: 16/420,946

(22) Filed: May 23, 2019

(51) Int. Cl.
*G06F 15/78* (2006.01)
*G06F 16/901* (2019.01)
*G06F 30/20* (2020.01)
*H04L 49/109* (2022.01)
*H04L 49/25* (2022.01)

(52) U.S. Cl.
CPC ...... *G06F 15/7892* (2013.01); *G06F 15/7821* (2013.01); *G06F 16/9024* (2019.01); *G06F 30/20* (2020.01); *H04L 49/109* (2013.01); *H04L 49/25* (2013.01)

(58) Field of Classification Search
CPC .. G06F 15/78; G06F 15/7821; G06F 15/7892; G06F 16/901; G06F 16/9024; G06F 16/9027; G06F 30/20; G06F 30/30; H04L 49/25; H04L 49/109; H04L 49/355
USPC ........................................................ 709/242
See application file for complete search history.

(56) References Cited

U.S. PATENT DOCUMENTS

| | | |
|---|---|---|
| 5,848,264 A | 12/1998 | Baird et al. |
| 6,090,156 A | 7/2000 | MacLeod |
| 7,080,283 B1 | 7/2006 | Songer et al. |
| 7,310,793 B1 * | 12/2007 | Teig ............... H01L 23/528 257/774 |
| 7,350,173 B1 * | 3/2008 | Ang ............... G06F 30/398 716/114 |

(Continued)

FOREIGN PATENT DOCUMENTS

| | | | | |
|---|---|---|---|---|
| CN | 104077429 A | * | 10/2014 | ......... G06F 17/5081 |
| CN | 107070795 A | * | 8/2017 | ............ H04L 45/16 |
| DE | 102018006894 A1 | * | 12/2018 | .......... G06F 11/0709 |

OTHER PUBLICATIONS

"Xilinx Unveils Revolutionary Adaptable Computing Product Category", Xilinx, Inc., Mar. 19, 2018,(https://www.xilinx.com/news/press/2018/xilinx-unveils-revolutionary-adaptable-computing-product-category.html).

(Continued)

*Primary Examiner* — James N Fiorillo
(74) *Attorney, Agent, or Firm* — Patterson + Sheridan, LLP

(57) ABSTRACT

Some examples described herein relate to packet identification (ID) assignment for a routing network in a programmable integrated circuit (IC). In an example, a design system includes a processor and a memory coupled to the processor. The memory stores instruction code. The processor is configured to execute the instruction code to construct an interference graph based on routes of logical nets through switches in a routing network, and assign identifications to the routes comprising performing vertex coloring of vertices of the interference graph. The interference graph includes the vertices and interference edges. Each vertex represents one of the logical nets having a route. Each interference edge connects two vertices that represent corresponding two logical nets that have routes that share at least one port of a switch. The identifications correspond to values assigned to the vertices by the vertex coloring.

20 Claims, 11 Drawing Sheets

(56) References Cited

U.S. PATENT DOCUMENTS

| | | | |
|---|---|---|---|
| 8,079,002 B1* | 12/2011 | Lo | G06F 30/34 716/121 |
| 8,719,808 B1 | 5/2014 | Prinzing | |
| 9,148,369 B2* | 9/2015 | Armstrong | H04L 45/44 |
| 9,578,099 B2* | 2/2017 | Llorca | H04L 67/566 |
| 10,289,784 B1* | 5/2019 | Hwang | G06F 30/327 |
| 10,528,644 B1* | 1/2020 | Zhang | G06F 17/18 |
| 10,977,401 B1* | 4/2021 | Arnold | G06F 30/343 |
| 11,138,019 B1* | 10/2021 | Sastry | G06F 8/443 |
| 2007/0067610 A1* | 3/2007 | Kra | H04L 69/12 712/220 |
| 2007/0234258 A1* | 10/2007 | Lee | G06F 30/18 716/112 |
| 2010/0322237 A1 | 12/2010 | Raja et al. | |
| 2013/0145329 A1* | 6/2013 | Brandt | G06F 30/39 716/104 |
| 2015/0026651 A1* | 1/2015 | Luo | G03F 1/70 716/52 |
| 2015/0207896 A1* | 7/2015 | Llorca | H04L 67/60 709/213 |
| 2017/0060958 A1* | 3/2017 | Van Rest | G06F 16/9024 |
| 2017/0195258 A1 | 7/2017 | Wang et al. | |
| 2017/0207998 A1* | 7/2017 | Fraisse | H04L 45/16 |
| 2017/0220499 A1 | 8/2017 | Gray | |
| 2017/0364534 A1* | 12/2017 | Zhang | G06F 16/284 |
| 2019/0104087 A1* | 4/2019 | Singarayan | H04L 49/25 |
| 2020/0202064 A1* | 6/2020 | Sriram | G06F 30/3953 |
| 2020/0371759 A1* | 11/2020 | Sastry | G06F 30/343 |

OTHER PUBLICATIONS

"Versal: The First Adaptive Computer Acceleration Platform (ACAP)", Xilinx, Inc., WP505 (v1.0), Oct. 2, 2018 (https://www.xilinx.com/support/documentation/white_papers/wp505-versal-acap.pdf).

Bokhari, S.H., "On the mapping problem," IEEE Transactions on Computers, Mar. 1981, vol. 1, No. 3, pp. 207-214.

Xilinx, "Xilinx AI Engines and Their Applications," WP506 (v1.0.2), Oct. 3, 2018, 13 pg., Xilinx, Inc., San Jose, California, USA.

Xilinx, "SDAccel Development Environment User Guide," UG1023 (v.2015.1), Sep. 15, 2015, 95 pg., Xilinx, Inc., San Jose, California, USA.

Xilinx, "Versal Architecture and Product Data Sheet: Overview," DS950 (v1.0), Oct. 2, 2018, 23 pg., Xilinx, Inc., San Jose, California, USA.

* cited by examiner

PACKET IDENTIFICATION (ID) ASSIGNMENT FOR ROUTING NETWORK

TECHNICAL FIELD

This disclosure relates to a programmable integrated circuit (IC) and, more particularly, to packet identification (ID) assignment for a routing network in a programmable IC.

BACKGROUND

A programmable integrated circuit (IC) refers to a type of IC that includes programmable circuitry. An example of a programmable IC is a field programmable gate array (FPGA). An FPGA is characterized by the inclusion of programmable circuit blocks. Circuit designs may be physically implemented within the programmable circuitry of a programmable IC by loading configuration data, sometimes referred to as a configuration bitstream, into the device. The configuration data may be loaded into internal configuration memory cells of the device. The collective states of the individual configuration memory cells determine the functionality of the programmable IC. For example, the particular operations performed by the various programmable circuit blocks and the connectivity between the programmable circuit blocks of the programmable IC are defined by the collective states of the configuration memory cells once loaded with the configuration data.

Circuit designs could be created by generating circuits using primitives and/or writing hardware description language (HDL) code. Configuration data is then generated from the primitives and/or HDL, including placing logic and routing between the placed logic. Various verification and validation methods could be implemented to ensure the proper functioning of the circuit design.

SUMMARY

Some examples described herein relate to packet identification (ID) assignment for a routing network in a programmable integrated circuit (IC). More specifically, examples described herein relate to packet ID assignment for packet-switched routing in a stream network of a data processing engine (DPE) array. A packet-switched switch allows multiple logical nets to share the same physical resources in the stream network thus improving usage of the stream network. The data of each logical net is prepended with a packet header containing a packet ID. In the stream network, the allowable range of packet IDs can be constrained, such as from numbers 0 to 31. A challenge of packet ID assignment in the stream network is to assign a packet ID within the constrained range to each logical net in a design so that stream switching routing can be implemented correctly. Two logical nets sharing a physical resource (e.g., route segment and/or port) should be assigned different packet IDs to permit proper routing. Two logical nets that do not share any physical resource can be assigned a same packet ID. Some examples include, based on routes of packet-switched streams, generating an interference graph with vertices connected by interference edges. Vertex coloring is performed on the interference graph. Values (e.g., "colors") of the vertices can be used to assign packet IDs to packet-switched streams. Hence, the number of packet IDs that are assigned can be reduced.

In an example, a design system includes a processor and a memory coupled to the processor. The memory stores instruction code. The processor is configured to execute the instruction code to generate routes of logical nets through switches in a routing network; construct an interference graph based on the routes; and assign identifications to the routes comprising performing vertex coloring of vertices of the interference graph. The interference graph includes the vertices and interference edges. Each of the vertices represents one of the logical nets for which a route was generated. Each of the interference edges connects two vertices that represent a corresponding two logical nets that have corresponding routes that share at least one port of a switch of the switches. The identifications correspond to values assigned to the vertices by the vertex coloring.

An example is a method for compiling an application for a programmable device. The method uses a processor-based system. Routes of logical nets are generated through switches in a routing network. An interference graph is constructed based on the routes. The interference graph includes vertices and interference edges. Each of the vertices represents one of the logical nets for which a route was generated. Each of the interference edges connects two vertices that represent a corresponding two logical nets that have corresponding routes that share at least one port of a switch of the switches. Identifications are assigned to the routes comprising performing vertex coloring of the vertices of the interference graph. The identifications correspond to values assigned to the vertices by the vertex coloring.

In an example, a design system includes a processor and a memory coupled to the processor. The memory stores instruction code. The processor is configured to execute the instruction code to iteratively, until an interference graph is empty: (i) construct the interference graph based on logical nets and routes of the logical nets through switches in a routing network; (ii) iteratively, while the interference graph includes a vertex having a number of interference edges incident on the vertex that is less than a number of available identifications, push the vertex to a stack and remove the pushed vertex and the interference edges incident on the pushed vertex from the interference graph; and (iii) if the interference graph is not empty, split a route of a logical net that corresponds to a vertex remaining in the interference graph into route segments. The interference graph includes vertices and interference edges. Each of the vertices represents one logical nets that has a route. Each of the interference edges connects two vertices that represent a corresponding two logical nets that have corresponding routes that share at least one port of a switch of the switches. The processor is further configured to execute the instruction code to iteratively, until the stack is empty, pop a popped vertex from the stack and assign the popped vertex a lowest value that does not equal a value assigned to any vertex that is connected to the popped vertex by an interference edge in the interference graph. Values assigned to the vertices correspond to identifications of the routes.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
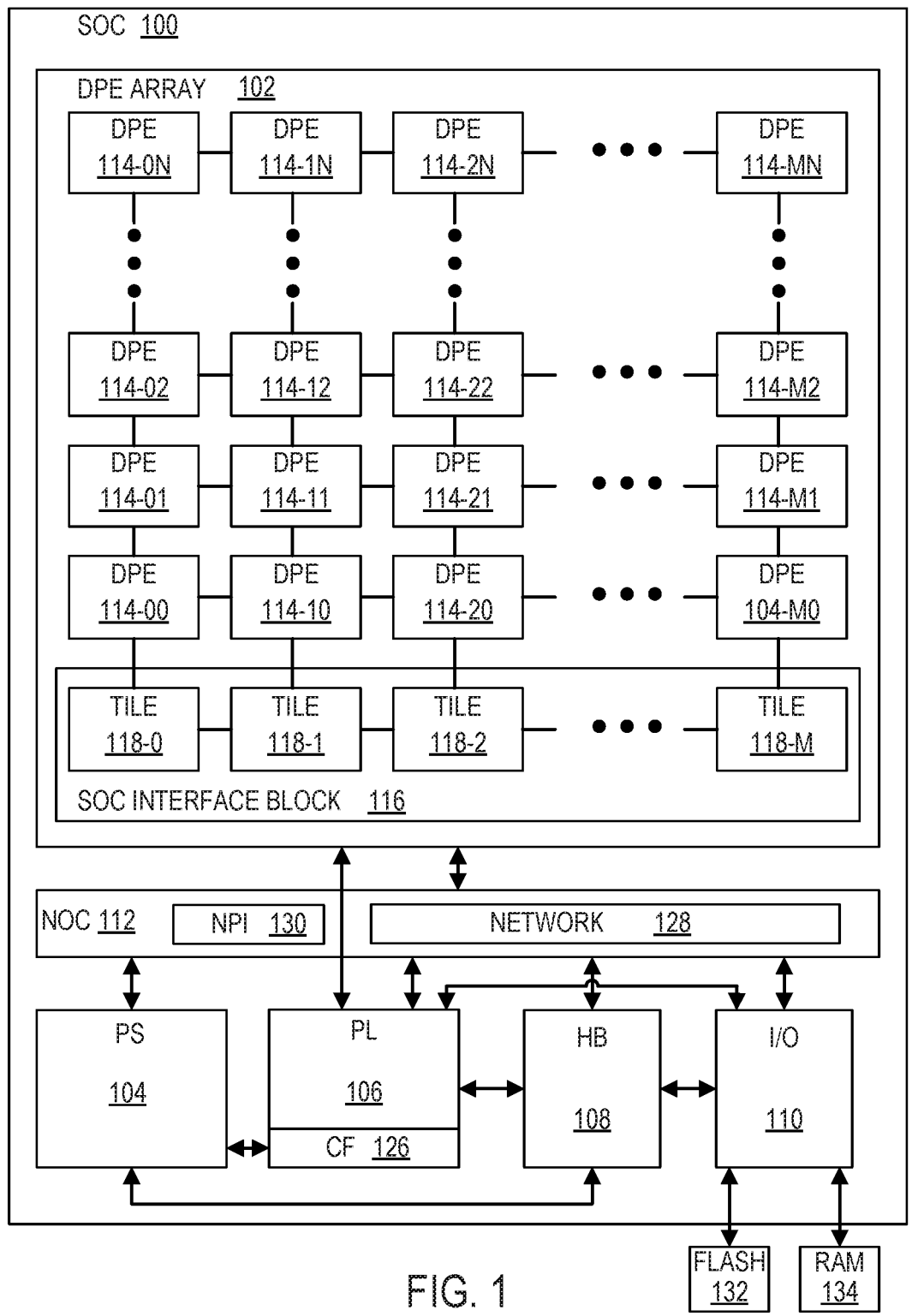
FIG. 1 depicts an architecture for a System-on-Chip (SoC) according to some examples.

Some examples described herein relate to packet identification (ID) assignment for a routing network in a programmable integrated circuit (IC). More specifically, examples described herein relate to packet ID assignment for packet-switched routing in a stream network of a data processing engine (DPE) array. A DPE array may include a plurality of DPEs. In general, a DPE can include a hardened core that is capable of providing data processing capabilities, a memory module that is accessible by the core, and a stream switch for communications of data streams. The DPE array can also include tiles that provide an interface between the DPE array and other subsystems of the programmable IC that includes the DPE array. Each of the tiles can also include a stream switch. The stream switches of DPEs and tiles of the DPE array can be interconnected to form a stream network.

An application can be implemented on the programmable IC, including implementing at least a portion of the application on the DPE array. The application can be in a graph format with kernels that are mapped to cores of DPE arrays and edges (e.g., communication links) between the kernels that are mapped to memory banks for shared memory communications and/or routed through the stream network as data streams. In some examples, the data streams can be circuit-switched streams or packet-switched streams. Packet-switched streams are capable of sharing hardware resources in the stream network, such as a port of a stream switch. Packet-switched streams include packet headers that include packet IDs, and the packet-switched streams are routed in the stream network based on the packet IDs. The packet IDs are generated during compiling of the application.

The architecture of a programmable IC as described herein can be highly complex and can implement highly complex applications. An application can implement a large number of kernels on a large number of cores, and a large number of packet-switched streams may be implemented as edges between the cores on which the kernels are mapped. A format of the packet headers may constrain the number of unique packet IDs that may be assigned to packet-switched streams. In some examples, the format may include a field for a packet ID that has up to ten bits. For example, if the packet header allocates five bits to a packet ID, thirty-two ($2^5$) unique packet IDs may be implemented. Since packet-switched streams can share hardware resources, packet IDs are assigned to the packet-switched streams to appropriately distinguish and route the packet-switched streams, which can be problematic for applications with a large number of packet-switched streams that can implement a constrained number of packet IDs.

In some examples, a compiler module is configured to map and route an application in the DPE array. Based on the routes of logical nets generated by the compiler module, the compiler module is further configured to generate packet IDs for packet-switched streams of logical nets routed in the stream network of the DPE array. Generating the packet IDs can include generating an interference graph of the packet-switched streams. The interference graph includes vertices that can be connected by interference edges. Each vertex of the interference graph represents a logical net that is routed by a packet-switched stream (e.g., a logical stream). The interference edges connect vertices that represent logical nets routed by packet-switched streams that share at least one port of a stream switch. Generally, vertex coloring is performed on the interference graph such that no two vertices connected by an interference edge have a same color. In some instances, if an interference graph has interference that can cause a number of colors to be assigned to vertices to exceed the number of available packet IDs, one or more vertices may be split by splitting, logically and/or physically, a corresponding route(s) to thereby create more vertices with less interference. Packet IDs can be assigned to the packet-switched streams based on the coloring of the respective vertices that represent the corresponding logical nets (and corresponding packet-switched streams).

Some examples described herein are described in the context of a heterogeneous data processing architecture of a programmable IC. More specifically, for example, the architecture described below includes (i) programmable logic regions (e.g., fabric of an FPGA) that are capable of being configured to process data, (ii) a processing system, and (iii) DPEs, each with a core, that are also capable of being programmed to process data. Some examples can be extended to homogeneous data processing architectures, such as, for example, multi-core processors (e.g., without programmable logic regions) where communications are routed based on an identification. More generally, other examples can be applied to other routing networks, such as a Network-on-Chip (NoC). Other routing networks can include any network that routes packets and/or data based on an identification of the packets and/or data.

Due to the novelty of the heterogeneous data processing architecture described herein, no processor-based system (e.g., a computer) was available for compiling an application to be executed on a programmable IC having the heterogeneous data processing architecture. Accordingly, a technical problem existed in that no processor-based system was available to compile an application to be executed by a programmable IC having the heterogeneous data processing architecture that includes a stream network with packet-switching routing capabilities. Some examples provide a solution to this problem by providing a compiler in a processor-based system that is capable of compiling an application to execute in the heterogeneous data processing architecture, including generating packet IDs for routing in the stream network by packet-switching.

Techniques and processor-based systems for assigning packet IDs for routing in a network have been implemented previously. However, these techniques for generating packet IDs did not generally operate within the constraints and challenges provided by an architecture as described herein. More specifically, the constrained number of available packet IDs and possible large number of packet-switched streams that could be implemented in the stream network rendered previous techniques and processor-based systems unable to converge on a solution for some applications. Accordingly, a technical problem existed in that packet IDs were not able to be successfully generated for some applications by a processor-based system. Various examples provide solutions to these problems by providing a processor-based system capable of generating an interference graph based on generated routes of an application and performing vertex coloring of vertices of the interference graph for assigning packet IDs, which can reduce the number of packet IDs implemented for packet-switched streams in the stream network.

Aspects of these and other examples are described below. Additional or other benefits may be achieved by various examples, as a person having ordinary skill in the art will readily understand upon reading this disclosure.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations. Even further, various directions or orientations are described as, e.g., a column and a row; horizontal and vertical; bottom or below, top or above, left, and right; and south, north, west, and east. These designations are for ease of description, and other directions or orientations may be implemented.

FIG. 1 illustrates an architecture for a System-on-Chip (SoC) 100 according to some examples. The architecture can be modified with any number of variations, some of which may be identified in the following description.

The SoC 100 includes a plurality of subsystems, including a DPE array 102, a processing system (PS) 104, programmable logic (PL) 106, hard block circuits (HB) 108, input/output circuits (I/O) 110, and a Network-on-Chip (NoC) 112. In some examples, each sub-system includes at least some component or circuit that is programmable, such as described herein. In some examples, some of the subsystems can include a non-programmable application-specific circuit. Other circuits can be included in the SoC 100, such as other IP blocks like a system monitor or others.

The DPE array 102 includes a plurality of interconnected DPEs 114-00 through 114-MN (collectively or individually, DPE(s) 114). Each of the DPEs 114 is a hardwired circuit block and may be programmable. Each of the DPEs 114 can include the architecture as illustrated in and described below with respect to FIG. 2. In the example of FIG. 1, the DPE array 102 includes a two-dimensional array of DPEs 114 and an SoC interface block 116. The DPE array 102 may be implemented using any of a variety of different architectures. FIG. 1 illustrates DPEs 114 arranged in aligned rows and aligned columns. The DPE array 102 has M+1 columns of DPEs 114 and N+1 rows of DPEs 114. The reference numerals of the DPEs 114 in FIG. 1 indicate the positioning of each DPE 114 by the reference number "114-[column][row]." In some examples, DPEs 114 may be arranged where DPEs 114 in selected rows and/or columns are horizontally inverted or flipped relative to DPEs 114 in adjacent rows and/or columns. In other examples, rows and/or columns of DPEs 114 may be offset relative to adjacent rows and/or columns.

As described in more detail below, the DPEs 114 can communicate various data by different mechanisms within the DPE array 102. The DPEs 114 are connected to form a DPE interconnect network. To form the DPE interconnect network, each DPE 114 is connected to vertically neighboring DPE(s) 114 and horizontally neighboring DPE(s) 114. For example, DPE 114-11 is connected to vertically neighboring DPEs 114 within column 1, which are DPEs 114-10 and 114-12, and is connected to horizontally neighboring DPEs 114 within row 1, which are DPEs 114-01 and 114-21. DPEs 114 at a boundary of the DPE array 102 may be connected to fewer DPEs 114. The DPE interconnect network includes a stream network and a memory mapped network. The stream network includes interconnected stream switches, and application data and direct memory accesses (DMAs) may be communicated between the DPEs 114 via the stream network. The memory mapped network includes interconnected memory mapped switches, and configuration and control data can be communicated between the DPEs 114 via the memory mapped network. Neighboring DPEs 114 can further communicate via shared memory. An independent cascade stream can be implemented between DPEs 114.

The DPE array 102 further includes the SoC interface block 116 that includes tiles 118-0 through 118-M (collectively or individually, tile(s) 118). Each of the tiles 118 of the SoC interface block 116 may be hardwired and programmable. Each of the tiles 118 can include the architecture as illustrated in and described below with respect to FIG. 3. The SoC interface block 116 provides an interface between DPEs 114 of DPE array 102 and other subsystems of the SoC 100, such as the NoC 112 and the PL 106.

In some examples, the SoC interface block 116 is coupled to adjacent DPEs 114. For example, as illustrated in FIG. 1, the SoC interface block 116 may be connected to each DPE 114 in the bottom row of DPEs 114-x0 in the DPE array 102 (where "x" indicates a given column). More particularly, in FIG. 1, each tile 118 of the SoC interface block 116 is connected to a neighboring DPE 114 within the column of the DPE array 102 in which the respective tile 118 is disposed. In FIG. 1, tile 118-0 is connected to DPE 114-00; tile 118-1 is connected to DPE 114-10; tile 118-2 is connected to DPE 114-20; etc. Additionally, each tile 118 is connected to neighboring tiles 118. The SoC interface block 116 is capable of communicating data through the tiles 118, e.g., of propagating data from tile 118-0 to tile 118-1, from tile 118-1 to tile 118-2, etc., and vice versa. A tile 118 within the SoC interface block 116 can communicate with a DPE 114 to which the tile 118 is connected, and the communication can be routed through the DPE interconnect network formed by the interconnected DPEs 114 to a target DPE 114.

Each tile 118 can service a subset of DPEs 114 in the DPE array 102. In the example of FIG. 1, each tile 118 services the column of DPEs 114 above the respective tile 118. The tiles 118 also include stream switches, which are interconnected in the stream network to stream switches of the DPEs 114, and memory mapped switches, which are interconnected in the memory mapped network to memory mapped switches of the DPEs 114. Communications from DPEs 114 can be communicated with the tile 118 below the respective DPEs 114 via the interconnected stream switches and/or memory mapped switches. The tile 118 can provide an interface to the PL 106 and/or the NoC 112 for communications therewith.

The PS 104 may be or include any of a variety of different processor types and number of processor cores. For example, the PS 104 may be implemented as an individual processor, e.g., a single core capable of executing program instruction code. In another example, the PS 104 may be implemented as a multi-core processor. The PS 104 may be implemented using any of a variety of different types of architectures. Example architectures that may be used to implement the PS 104 may include an ARM processor architecture, an x86 processor architecture, a graphics processing unit (GPU) architecture, a mobile processor architecture, a digital signal processor (DSP) architecture, or other suitable architecture that is capable of executing computer-readable program instruction code.

The PL 106 is logic circuitry that may be programmed to perform specified functions. As an example, the PL 106 may be implemented as fabric of an FPGA. The PL 106 can include programmable logic elements including configurable logic blocks (CLBs), look-up tables (LUTs), random access memory blocks (BRAM), Ultra RAMs (URAMs), input/output blocks (IOBs), digital signal processing blocks (DSPs), clock managers, and/or delay lock loops (DLLs). In some architectures, the PL 106 includes columns of programmable logic elements, where each column includes a single type of programmable logic element (e.g., a column of CLBs, a column of BRAMs, etc.). The programmable logic elements can have one or more associated programmable interconnect elements. For example, in some architectures, the PL 106 includes a column of programmable interconnect elements associated with and neighboring each column of programmable logic elements. In such examples, each programmable interconnect element is connected to an associated programmable logic element in a neighboring column and is connected to neighboring programmable interconnect elements within the same column. The interconnected columns of programmable interconnect elements can form a global routing network within the PL 106.

The PL 106 has an associated configuration frame interconnect (CF) 126. A configuration frame node residing on a platform management controller (PMC) of the PS 104 is connected to the CF 126. The PMC sends configuration data to the configuration frame node, and the configuration frame node formats the configuration data in frames and transmits the frames through the CF 126 to the programmable logic elements and programmable interconnect elements. The configuration data may then be loaded into internal configuration memory cells of the programmable logic elements and programmable interconnect elements that define how the programmable elements are configured and operate. Any number of different sections or regions of PL 106 may be implemented in the SoC 100.

The HB 108 can be or include memory controllers (such as double data rate (DDR) memory controllers, high bandwidth memory (HBM) memory controllers, or the like), peripheral component interconnect express (PCIe) blocks, Ethernet cores (such as a 100 Gbps (C=100) media address controller (CMAC), a multi-rate MAC (MRMAC), or the like), forward error correction (FEC) blocks, Analog-to-Digital Converters (ADC), Digital-to-Analog Converters (DAC), and/or any other hardened circuit. The I/O 110 can be implemented as eXtreme Performance Input/Output (XPIO), multi-gigabit transceivers (MGTs), or any other input/output blocks. Any of the HB 108 and/or I/O 110 can be programmable.

The NoC 112 includes a programmable network 128 and a NoC peripheral interconnect (NPI) 130. The programmable network 128 communicatively couples subsystems and any other circuits of the SoC 100 together. The programmable network 128 includes NoC packet switches and interconnect lines connecting the NoC packet switches. Each NoC packet switch performs switching of NoC packets in the programmable network 128. The programmable network 128 has interface circuits at the edges of the programmable network 128. The interface circuits include NoC master units (NMUs) and NoC slave units (NSUs). Each NMU is an ingress circuit that connects a master circuit to the programmable network 128, and each NSU is an egress circuit that connects the programmable network 128 to a slave endpoint circuit. NMUs are communicatively coupled to NSUs via the NoC packet switches and interconnect lines of the programmable network 128. The NoC packet switches are connected to each other and to the NMUs and NSUs through the interconnect lines to implement a plurality of physical channels in the programmable network 128. The NoC packet switches, NMUs, and NSUs include register blocks that determine the operation of the respective NoC packet switch, NMU, or NSU.

A physical channel can also have one or more virtual channels. The virtual channels can implement weights to prioritize various communications along any physical channel. The NoC packet switches also support multiple virtual channels per physical channel. The programmable network 128 includes end-to-end Quality-of-Service (QoS) features for controlling data-flows therein. In examples, the programmable network 128 first separates data-flows into designated traffic classes. Data-flows in the same traffic class can either share or have independent virtual or physical transmission paths. The QoS scheme applies multiple levels of priority across traffic classes. Within and across traffic classes, the programmable network 128 applies a weighted arbitration scheme to shape the traffic flows and provide bandwidth and latency that meets the user requirements.

The NPI 130 includes circuitry to write to register blocks that determine the functionality of the NMUs, NSUs, and NoC packet switches. The NPI 130 includes a peripheral interconnect coupled to the register blocks for programming thereof to set functionality. The register blocks in the NMUs, NSUs, and NoC packet switches of the programmable network 128 support interrupts, QoS, error handling and reporting, transaction control, power management, and address mapping control. The NPI 130 includes an NPI root node residing on the PMC of the PS 104, interconnected NPI switches connected to the NPI root node, and protocol blocks connected to the interconnected NPI switches and a corresponding register block.

To write to register blocks, a master circuit, such as the PMC of the PS 104, sends configuration data to the NPI root node, and the NPI root node packetizes the configuration data into a memory-mapped write request in a format implemented by the NPI 130. The NPI transmits the memory-mapped write request to interconnected NPI switches, which route the request to a protocol block connected to the register block to which the request is directed. The protocol block can then translate the memory-mapped transaction write request into a format implemented by the register block and transmit the translated request to the register block for writing the configuration data to the register block. The NPI 130 may be used to program any programmable boundary circuit of the SoC 100. For example, the NPI 130 may be used to program any HB 108 and/or I/O 110 that is programmable.

Various subsystems and circuits of the SoC 100 are communicatively coupled by various communication mechanisms. Some subsystems or circuits can be directly connected to others. As illustrated the I/O 110 is directly connected to the HB 108 and PL 106, and the HB 108 is further directly connected to the PL 106 and the PS 104. The PL 106 is directly connected to the DPE array 102. The DPE array 102, PS 104, PL 106, HB 108, and I/O 110 are communicatively coupled together via the programmable network 128 of the NoC 112.

DPEs 114 and tiles 118 may be programmed by loading configuration data into configuration registers that define operations of the DPEs 114 and tiles 118, by loading program instruction code into program memory for execution by the DPEs 114, and/or by loading application data into memory banks of the DPEs 114. The PMC of the PS 104 can transmit configuration data, program instruction code, and/or application data via the programmable network 128 of the NoC 112 to one or more tiles 118 in the SoC interface block 116 of the DPE array 102. At each tile 118 that receives configuration data, program instruction code, and/or application data, the configuration data, program instruction code, and/or application data received from the programmable network 128 is converted into a memory mapped transaction that is routed via the memory mapped network to a configuration register, program memory, and/or memory bank addressed by the memory mapped transaction (and hence, to a target DPE 114 or tile 118). The configuration data, program instruction code, and/or application data is written to the configuration register, program memory, and/or memory bank, respectively, by the memory mapped transaction.

Using a DPE array as described herein in combination with one or more other subsystems provides heterogeneous processing capabilities of the SoC 100. The SoC may have increased processing capabilities while keeping area usage and power consumption low. For example, the DPE array 102 may be used to hardware accelerate particular operations and/or to perform functions offloaded from one or more of the subsystems of the SoC 100. When used with a PS 104, for example, the DPE array 102 may be used as a hardware accelerator. The PS 104 may offload operations to be performed by the DPE array 102 or a portion thereof. In other examples, the DPE array 102 may be used to perform computationally resource intensive operations such as generating digital pre-distortion to be provided to analog/mixed signal circuitry.

In some examples, the SoC 100 can be communicatively coupled to other components. As illustrated, the SoC 100 is communicatively coupled to flash memory 132 and to RAM 134 (e.g., DDR dynamic RAM (DDRDRAM)). The flash memory 132 and RAM 134 may be separate chips and located, e.g., on a same board (e.g., evaluation board) as the SoC 100. The flash memory 132 and the RAM 134 are communicatively coupled to the I/O 110, which is connected to HB 108 (e.g., one or more memory controllers). The HB 108 is connected to the PS 104 (e.g., the PMC). The PMC is capable of reading data from the flash memory 132 via the HB 108 and I/O 110, and writing the read data to local RAM and/or, via the HB 108 and I/O 110, to the RAM 134.

Figure 2:
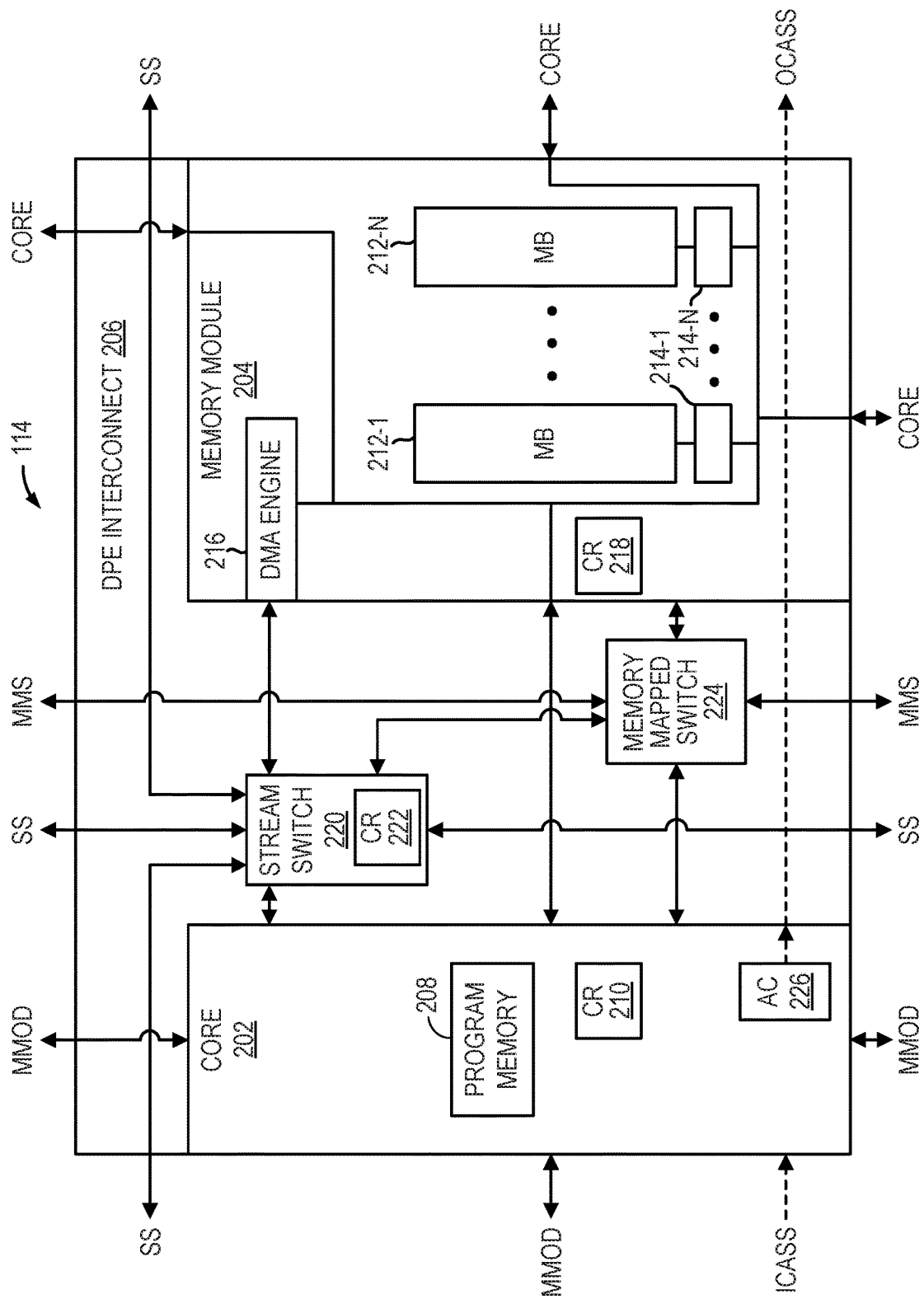
FIG. 2 depicts an architecture for a data processing engine (DPE) according to some examples.

FIG. 2 illustrates an architecture for a DPE 114 according to some examples. In the example of FIG. 2, DPE 114 includes a hardened core 202, a memory module 204, and DPE interconnect 206.

The core 202 provides data processing capabilities of the DPE 114. The core 202 may be implemented as any of a variety of different processing circuits. In some examples, the core 202 is implemented as a processor that is capable of executing program instruction code, e.g., computer readable program instruction code. Program memory 208 is included in the core 202 and is capable of storing program instruction code that is executed by the core 202. The core 202, for example, may be implemented as a CPU, a GPU, a DSP, a vector processor, or another type of processor that is capable of executing program instruction code. The core 202 may include configuration registers (CR) 210 that may be loaded with configuration data to control operation of core 202. In some examples, the core 202 may be activated and/or deactivated based upon configuration data loaded into the configuration registers 210.

The memory module 204 includes memory banks 212-1 to 212-N. The memory banks 212-1 to 212-N are capable of storing data that may be read and consumed by one or more core and data (e.g., results) that may be written by one or more core. In some examples, each memory bank 212 is single-ported thereby allowing up to one access to each memory bank each clock cycle. In other examples, each memory bank 212 is dual-ported or multi-ported thereby allowing a larger number of parallel accesses each clock cycle. Each of memory banks 212-1 through 212-N has an arbiter 214-1 through 214-N. Each arbiter 214 may include arbitration logic. Further, each arbiter 214 may include a crossbar.

The memory module 204 further includes DMA engine 216. In some examples, DMA engine 216 is capable of (i) receiving input data streams from the DPE interconnect 206 and writing the received data to memory banks 212, and (ii) reading data from memory banks 212 and sending the data out via the DPE interconnect 206, as described below. Through DMA engine 216, application data may be received from other sources (e.g., other subsystems or any DPE 114) within the SoC 100 and stored in the memory module 204. Through DMA engine 216, data may be read from the memory banks 212 of memory module 204 and sent to other destinations (e.g., other subsystems or any DPE 114). The memory module 204 may include configuration registers (CR) 218 that may be loaded with configuration data to control operation of the memory module 204. More specifically, the DMA engine 216 may be controlled by the configuration registers 218.

The DPE interconnect 206 in the DPE 114 facilitates communication with one or more other DPEs and/or with other subsystems of the SoC 100. The DPE interconnect 206 further enables communication of configuration and control data with the DPE 114. In some examples, the DPE interconnect 206 is implemented as an on-chip interconnect, such as an Advanced Microcontroller Bus Architecture (AMBA) eXtensible Interface (AXI) bus (e.g., or switch) and/or other interconnect circuitry.

The DPE interconnect 206 includes a stream network and a memory mapped network. The stream network is capable of exchanging data (e.g., application data) with other DPEs of DPE array 102 and/or other subsystems of the SoC 100. The memory mapped network is capable of exchanging data such as configuration and control data for the DPE(s).

The stream network of DPE interconnect 206 includes a stream switch 220 in each DPE 114, and stream switches 220 of DPEs are interconnected in forming the stream network. The stream switch 220 is used to communicate with other DPEs and/or the SoC interface block 116. For example, the stream switch 220 can communicate with a stream switch (SS) in a DPE 114 or tile 118 in the SoC interface block 116 in each cardinal direction—e.g., to the left, above, right, and below. The stream switch 220 is capable of allowing non-neighboring DPEs to communicate with the core 202 and/or the memory module 204 via the stream network. The stream switch 220 can communicate with the core 202 and the memory module 204. The core 202 can therefore communicate with other DPEs 114 via the stream switch 220. The stream switch 220 can also communicate with the DMA engine 216 of the memory module 204, which permits other DPEs 114 to communicate with the DMA engine 216. Cores of other DPEs may access the memory banks 212 of the memory module via the stream switch 220 (and stream network) and the DMA engine 216. The stream switch 220 may include configuration registers (CR) 222 to which configuration data may be written that can dictate which other DPEs and/or subsystems (e.g., the PL 106 and/or the PS 104) the DPE 114 can communicate with via the stream switch 220 and can dictate operation of the stream switch 220 (e.g., establishing circuit-switched point-to-point connections or packet-switched connections). When a data stream is implemented as a packet-switched stream through one or more stream switches 220, the stream switches 220 route the packet-switched stream based on a packet ID in a packet header of the data stream. In some examples, cores 202 and DMA engines 216 are capable of prepending a packet header including a packet ID to a data stream for packet-switched routing of the data stream.

The memory mapped network of DPE interconnect 206 includes a memory mapped switch 224 in each DPE 114, and memory mapped switches 224 of DPEs are interconnected in forming the memory mapped network. The memory mapped switch 224 is used to exchange configuration and control data for the DPE 114. The memory mapped switch 224 is capable of receiving configuration data that is used to configure the DPE 114. The memory mapped switch 224 may receive configuration data from a memory mapped switch (MMS) of a DPE and/or a tile 118 located below DPE 114. The memory mapped switch 224 is capable of forwarding received configuration data to a memory mapped switch (MMS) of another DPE above DPE 114, to program memory 208 and/or configuration registers 210 within the core 202, to memory banks 212 and/or configuration registers 218 in the memory module 204, and/or to configuration registers 222 within the stream switch 220.

In some examples, the DPE array 102 is mapped to the address space of the PS 104. Accordingly, any configuration registers and/or memories within any DPE 114 may be accessed via the memory mapped network. For example, the program memory 208, the memory banks 212, and configuration registers 210, 218, 222 may be read and/or written via the memory mapped switch 224. Through the memory mapped network, subsystems of the SoC 100 are capable of reading an internal state of any configuration register 210, 218, 222, and are capable of writing configuration data to any configuration register 210, 218, 222. Through the memory mapped network, subsystems of the SoC 100 are capable of reading the program memory 208, and are capable of writing program instruction code to the program memory 208. Through the memory mapped network, subsystems of the SoC 100 are capable of reading data from and writing data to the memory bank 212 via the arbiters 214.

The memory module 204 is capable of communicating with a core (CORE) neighboring the memory module 204, and hence, is capable of operating as a shared memory that may be accessed by multiple DPEs. In the orientation of the example of FIG. 2, cores 202 of the illustrated DPE 114 and DPEs 114 above, to the right, and below the illustrated DPE 114 (e.g., cores that share a boundary with the memory module 204) can access the memory banks 212 through arbiters 214. Accordingly, in the example of FIG. 2, each core 202 or DPE 114 that has a shared boundary with the memory module 204 is capable of reading and writing to memory banks 212. If the orientation of the DPE 114 differs, orientations of cores that are capable of accessing the memory module 204 can differ.

The core 202 is capable of communicating with a memory module (MMOD) neighboring the core 202, and hence, is capable of accessing memory modules of other neighboring DPEs. In the orientation of the example of FIG. 2, the core 202 of the illustrated DPE 114 can access the memory modules of the illustrated DPE 114 and DPEs 114 above, to the left, and below the illustrated DPE 114 (e.g., memory modules that share a boundary with the core 202). Accordingly, in the example of FIG. 2, the core 202 is capable of reading and writing to any of the memory modules of DPEs that share a boundary with the core 202. The core 202 is capable of directing the read and/or write requests to the appropriate memory module based upon the addresses that are generated. If the orientation of the DPE 114 differs, orientations of memory modules that are capable of being accessed the core 202 can differ.

The core 202 may also include cascade interfaces, each of which is capable of providing direct communication with another core. The core 202 receives an input data stream (ICASS) directly from the core of the DPE to the left of the illustrated DPE 114. The received data stream may be provided to the data processing circuitry within core 202. The core 202 is capable of sending an output data stream (OCASS) directly to the core of the DPE to the right of the illustrated DPE 114. Each cascade interface may include a first-in-first-out (FIFO) interface for buffering. A cascade interface is capable of outputting to another core the contents of an accumulator register (AC) 226 in the core 202 and may do so each clock cycle. Accumulator register 226 may store data that is generated and/or being operated upon by data processing circuitry within core 202. The cascade interfaces may be programmed based upon configuration data loaded into the configuration registers 210 (e.g., activated or deactivated). In some other examples, the cascade interfaces are controlled by the core 202. For example, the core 202 may include program instruction code to read/write to the cascade interface(s).

Figure 3:
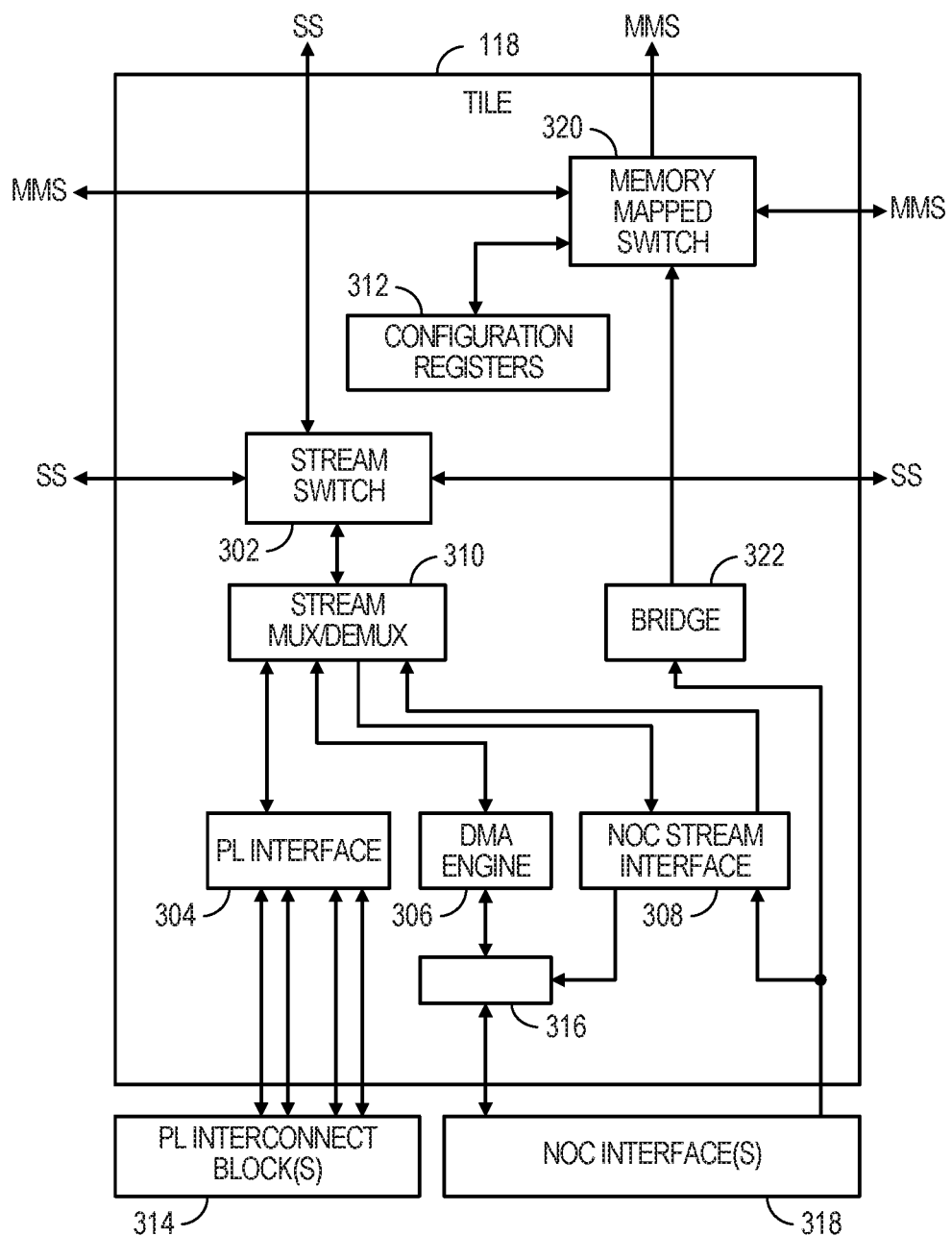
FIG. 3 depicts an architecture for a tile of a SoC interface block according to some examples.

FIG. 3 illustrates an example architecture for a tile 118 of the SoC interface block 116 according to some examples. In other implementations of a tile 118, a tile 118 may include additional or less circuitry and/or functionality. The tile 118 includes a stream switch 302. Stream switch 302 is connected horizontally to respective stream switches (SS) in neighboring tiles 118 and vertically to a stream switch (SS) in a neighboring DPE 114 to connect to and further form the stream network of the DPE array 102. Stream switches in neighboring tiles 118 are capable of exchanging data horizontally. The stream switch 302 is capable of communicating with the DPE 114 immediately above the tile 118. The stream switch 302 is also connected to and may communicate with a PL interface 304, a DMA engine 306, and/or to a NoC stream interface 308 via a stream multiplexer/demultiplexer ("stream mux/demux") 310.

The stream switch 302 is configurable by configuration data loaded into configuration registers 312. The stream switch 302, for example, may be configured to support packet-switched and/or circuit-switched operation based upon the configuration data. Further, the configuration data defines the particular DPE and/or DPEs within DPE array 102 to which stream switch 302 communicates.

The stream multiplexer/demultiplexer 310 is capable of directing data received from the PL interface 304, DMA engine 306, and/or NoC stream interface 308 to the stream switch 302. Similarly, the stream multiplexer/demultiplexer 310 is capable of directing data received from the stream switch 302 to the PL interface 304, DMA engine 306, and/or to NoC stream interface 308. The stream multiplexer/demultiplexer 310 may be programmed by configuration data stored in the configuration registers 312 to route selected data to the PL interface 304, to the DMA engine 306 where such data is sent over the programmable network 128 of the NoC 112 as memory mapped transactions, and/or to the NoC stream interface 308 where the data is sent over the programmable network 128 of the NoC 112 as a data stream.

The PL interface 304 couples to the PL 106 of the SoC 100 and provides an interface thereto. The PL interface 304 couples directly to one or more programmable interconnect elements and/or boundary logic interfaces (BLIs), generically, one or more PL interconnect blocks 314, in the PL 106. In some examples, the PL interface 304 is further coupled to other types of circuit blocks and/or subsystems to be capable of transferring data between tile 118 and such other subsystems and/or blocks.

The DMA engine 306 is capable of operating to direct data into the programmable network 128 of the NoC 112 through a selector block 316 and on to an NMU and/or NSU, generically, a NoC interface(s) 318. The DMA engine 306 is capable of receiving data from DPEs (via the stream network) and providing such data to the programmable network 128 of the NoC 112 as memory mapped transactions.

In some examples, the DMA engine 306 is capable of accessing an external memory. For example, DMA engine 306 is capable of receiving data streams from DPEs and sending the data stream to external memory through the programmable network 128 of the NoC 112 to a memory controller located within the SoC 100. The memory controller then directs the data received as data streams to the external memory (e.g., initiates reads and/or writes of the external memory as requested by DMA engine 306). Similarly, DMA engine 306 is capable of receiving data from external memory where the data may be distributed to other tile(s) 118 of SoC interface block 116 and/or up into target DPEs 114.

The NoC stream interface 308 is capable of receiving data from the programmable network 128 of the NoC 112 via the NoC interface(s) 318 and forwarding the data to the stream multiplexer/demultiplexer 310. The NoC stream interface 308 is further capable of receiving data from stream multiplexer/demultiplexer 310 and forwarding the data to NoC interface 318 through the selector block 316. The selector block 316 is configurable to pass data from the DMA engine 306 or from NoC stream interface 308 on to NoC interface (s) 318.

The tile 118 includes a memory mapped switch 320. The memory mapped switch 320 connects vertically to the memory mapped switch (MMS) of the DPE immediately above, which permits, for example, the memory mapped switch 320 to be capable of communicating with the column of DPEs above the tile 118 and to further form the memory mapped network of the DPE array 102. The memory mapped switch 320 connects horizontally to memory mapped switches (MMS) in neighboring tiles 118, which permits, for example, the memory mapped switch 320 to be capable of moving data (e.g., configuration and control data) from one tile to another to reach a correct column of DPEs and direct the data to the target DPE within the column. The memory mapped switch 320 may also connect to configuration registers 312 within tile 118. Through memory mapped switch 320, configuration data may be loaded into configuration registers 312 to control various functions and operations performed by components within tile 118. The memory mapped switch 320 is coupled to NoC interface(s) 318 via bridge 322. The bridge 322 is capable of converting memory mapped data transfers from the programmable network 128 of the NoC 112 (e.g., configuration and control data) into memory mapped data that may be received by memory mapped switch 320. Accordingly, the PS 104 or any other subsystem or circuit block can communicate with, e.g., a core 202 or memory module 204 of any DPE 114 via the memory mapped network of the DPE array 102.

Figure 4:
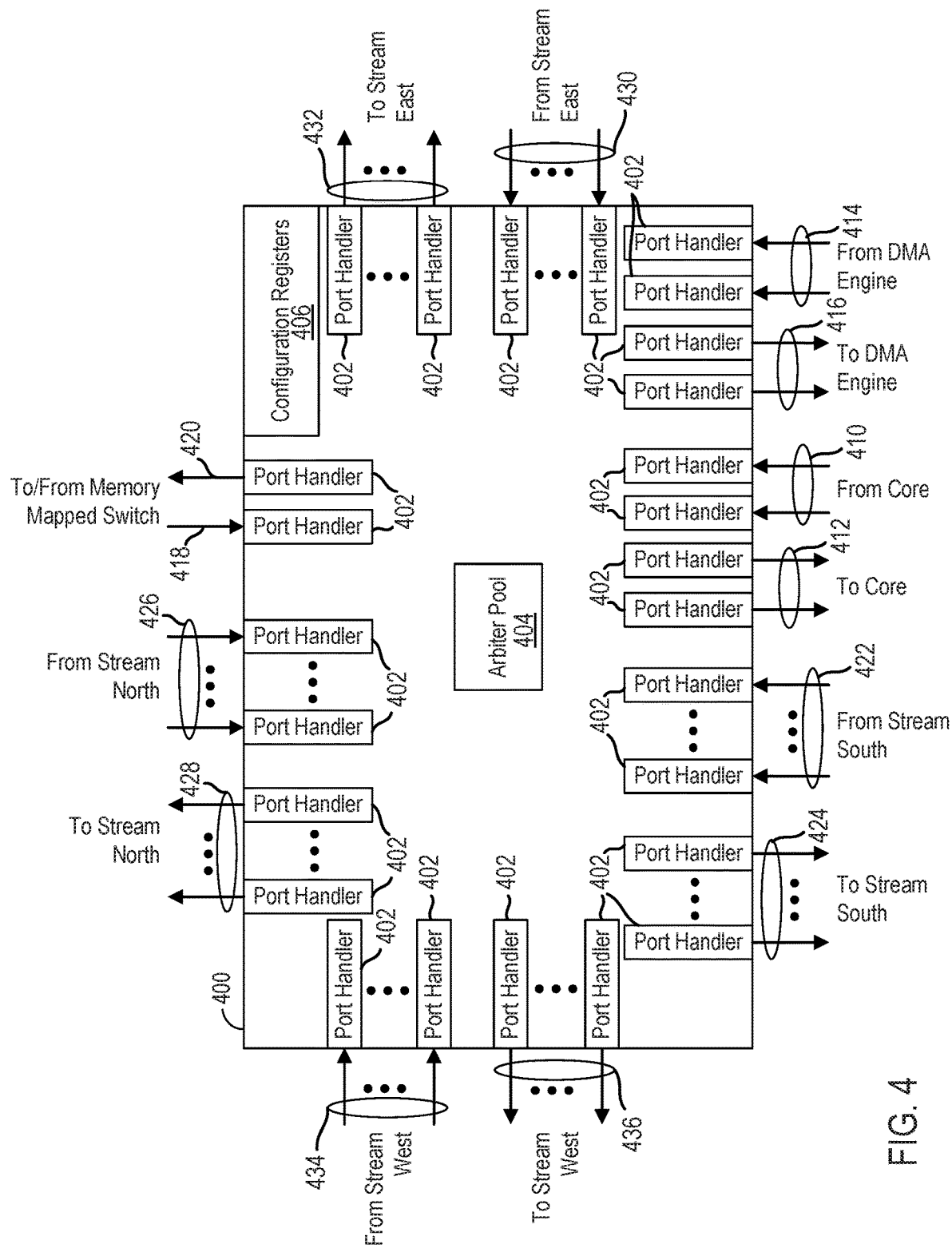
FIG. 4 depicts an architecture for a stream switch according to some examples.

FIG. 4 illustrates an example architecture for a stream switch 400 according to some examples. The stream switch 400 may be implemented as any of the stream switches 220, 302. The stream switch 400 includes input (e.g., slave) and output (e.g., master) port handlers 402 (or more generally, ports) that each are an interface for a data stream. The stream switch 400 includes an arbiter pool 404 that receives data streams from input port handlers 402 and determines which output port handlers 402 to direct the data streams. The stream switch 400 further includes configuration registers 406, which may be configuration registers 222, 312.

Two input connections 410 are connected from a core 202 to respective input port handlers 402, and two output connections 412 are connected to the core 202 from respective output port handlers 402. Two input connections 414 are connected from a DMA engine to respective input port handlers 402, and two output connections 416 are connected to the DMA engine from respective output port handlers 402. The connections 410, 412, 414, 416 may be for a stream switch 220 in a DPE 114, and may be omitted for a stream switch 302 in a tile 118. An input connection 418 is connected from a memory mapped switch, such as memory mapped switch 224, 320, and an output connection 420 is connected to the memory mapped switch. The connections 418, 420 may be for reading or writing to the configuration registers 406. Other numbers of connections and port handlers may be implemented.

A number (e.g., six) of input connections 422 are connected from a stream south, such as a stream switch 220, 302 in a DPE 114 or tile 118 below or a stream multiplexer/demultiplexer 310, to input port handlers 402, and a number (e.g., four) of output connections 424 are connected to a stream south, such as a stream switch 220, 302 in a DPE 114 or tile 118 below or a stream multiplexer/demultiplexer 310, from output port handlers 402. A number (e.g., four) of input connections 426 are connected from a stream north, such as a stream switch 220 in a DPE 114 above, to input port handlers 402, and a number (e.g., six) of output connections 428 are connected to a stream north, such as a stream switch 220 in a DPE 114 above, from output port handlers 402. A number (e.g., four) of input connections 430 are connected from a stream east, such as a stream switch 220, 302 in a DPE 114 or tile 118 to the right, to input port handlers 402, and a number (e.g., four) of output connections 432 are connected to a stream east, such as a stream switch 220, 302 in a DPE 114 or tile 118 to the right, from output port handlers 402. A number (e.g., four) of input connections 434 are connected from a stream west, such as a stream switch 220, 302 in a DPE 114 or tile 118 to the left, to input port handlers 402, and a number (e.g., four) of output connections 436 are connected to a stream west, such as a stream switch 220, 302 in a DPE 114 or tile 118 to the left, from output port handlers 402. Any number of connections and port handlers may be implemented.

Each of the port handlers 402 can be configured for circuit-switched operation or packet-switched operation by, e.g., a packet enable bit written to the configuration registers 406 corresponding to the respective port handler 402. When a port handler 402 is configured for circuit-switched operation, the port handler 402 can handle a single data stream. A circuit-switched stream generally cannot share physical resources, such as a port handler 402, with another data stream. A circuit-switched stream can be a one-to-one or one-to-many data stream having one source and one or many destinations. Each output port handler 402 has a corresponding value in the configuration registers 406 that identifies the corresponding input port handler 402 when the output port handler 402 is configured in circuit-switched operation. One or more output port handlers 402 can have a value in the configuration registers 406 that identifies the same input port handler 402 for a one-to-many data stream.

When a port handler 402 is configured for packet-switched operation, the port handler 402 may be able to handle a multiple packet-switched (e.g., logical) streams. Packet-switched streams may be able to share physical resources, such as a port handler 402, e.g., as long as the cumulative utilization of the shared physical resources does not exceed the capacity of the shared physical resources. A packet-switched stream includes a packet header that includes a packet ID. An arbiter of the arbiter pool 404 is capable of routing a packet-switched stream to a specified output port handler 402 based on the input port handler 402 on which the packet-switched stream was received and based on the packet ID. The routing information can be written to the configuration registers 406. Accordingly, multiple packet-switched streams may share a port handler 402 of a stream switch 400 since the multiple packet-switched streams may be individually routed based on respective packet IDs. In some examples, as stated previously, cores 202 of DPEs 114 and DMA engines 216 of memory modules 204 of DPEs 114 are capable of appending a packet header in a packet-switched stream.

Packet-switching operation permits many permutations of topologies within a stream switch 400. A packet-switched stream may be routed from a single input port handler 402 to a single output port handler 402. A packet-switched stream may be routed from a single input port handler 402 to multiple output port handlers 402. A packet-switched stream may be routed from multiple input port handlers 402 to a single output port handler 402. A packet-switched stream may be routed from multiple input port handlers 402 to multiple output port handlers 402.

In addition to a packet header, a packet-switched stream can include a data segment following the packet header, and can include an end of message indication following the data segment. In some examples, a portion of the data segment can implement a nested packet header, such as when the number of packet IDs implemented to route the packet-switched streams exceeds the available number of packet IDs without nesting. In such examples, an output port handler 402 of a stream switch 400 can strip the leading packet header from the packet-switched stream to expose the nested packet header, and hence, the nested packet ID. The nested packet ID can then be used to route the packet-switched stream.

Applications (e.g., a user design) can be designed, compiled, and loaded on the SoC 100 based on the architecture described above or on other programmable ICs based on other architectures. The applications can be compiled according to some examples.

Figure 5:
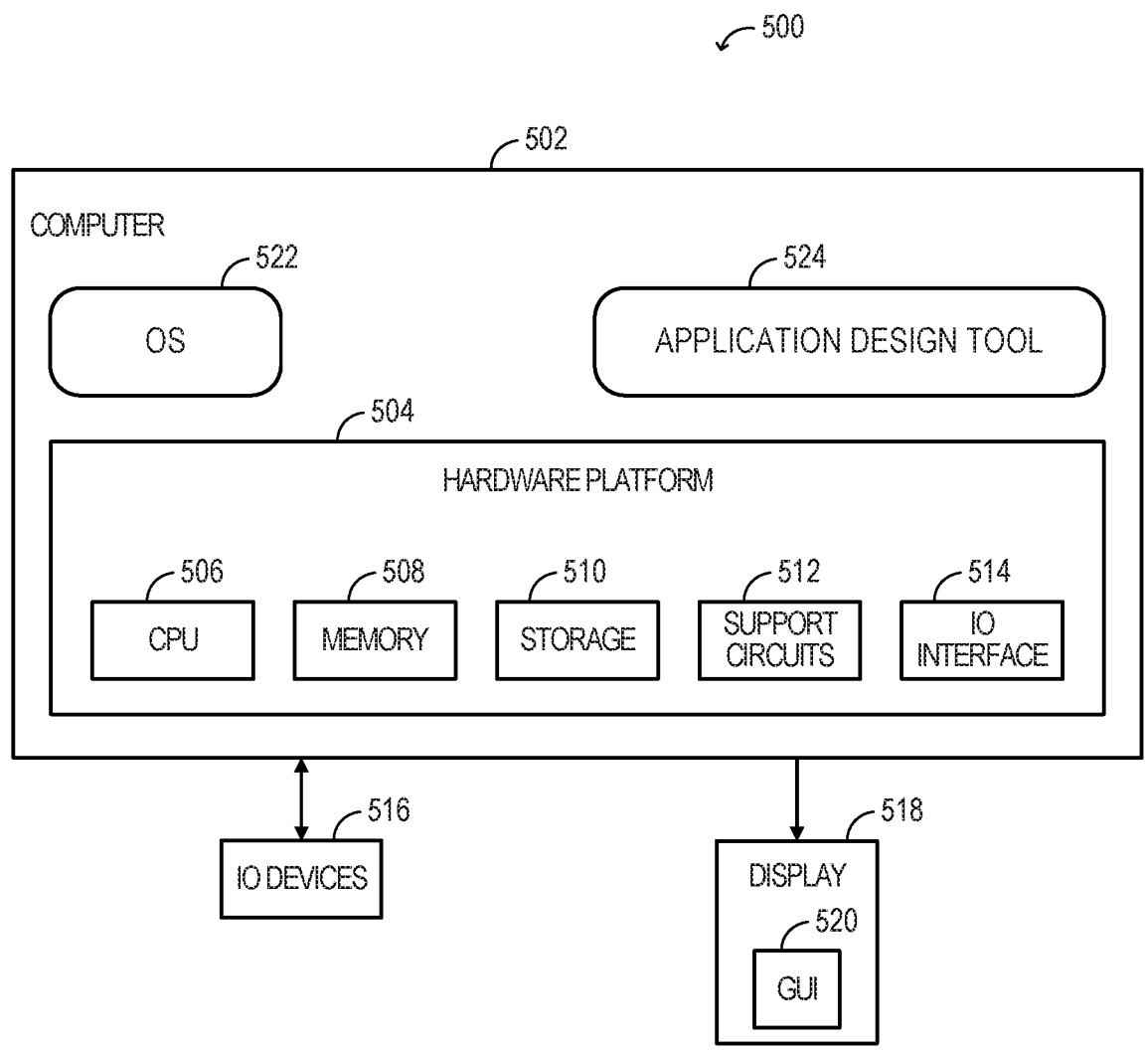
FIG. 5 is a block diagram depicting an example of an application design system in accordance with some examples.

FIG. 5 is a block diagram depicting an example of an application design system 500, in accordance with some examples. The application design system 500 (e.g., a processor-based system) can be used by a user to create an application that can be compiled to generate a boot image file that can be loaded on the SoC 100 of FIG. 1, for example. The application design system 500 includes a computer 502 coupled to input/output (IO) devices 516 and a display 518. The computer 502 includes a hardware platform 504 that can include components of a computing device, such as a central processing unit (CPU) 506, system memory 508, storage 510, various support circuits 512, and an IO interface 514. The CPU 506 can include one or more microprocessors. The CPU 506 is configured to execute program instruction code that performs one or more operations described herein. The program instruction code can be stored in system memory 508, storage 510, or any other memory in the hardware platform 504 (e.g., cache memory). The system memory 508 includes one or more non-transitory storage mediums that store information and can include, for example, RAM, ROM, or a combination thereof. The storage 510 includes one or more local non-transitory storage mediums, such as hard disks, flash memory modules, solid state disks, optical disks, and the like. The storage 510 can also include interface(s) configured for communication with one or more network data storage systems. The support circuits 512 can include cache, power supplies, clock circuits, data registers, IO interfaces, and the like. The IO interface 514 includes interfaces to/from the computer 502. The IO interface 514 can be coupled to the 10 devices 516, which can include a keyboard, mouse, and the like. The IO interface 514 can also be coupled to the display 518, which can present a graphical user interface (GUI) 520 to a user.

The computer 502 further includes a software platform comprising an operating system (OS) 522 and an application design tool 524. The OS 522 and the application design tool 524 include program instruction code that is executed by the CPU 506, which program instruction code can be stored in system memory 508, storage 510, or any other memory. The OS 522 can include any known operating system, such as Linux®, Microsoft Windows®, Mac OS®, and the like. The application design tool 524 is an application that executes within the OS 522, which provides an interface to the hardware platform 504. Some operation of the application design tool 524 is described below.

Figure 6:
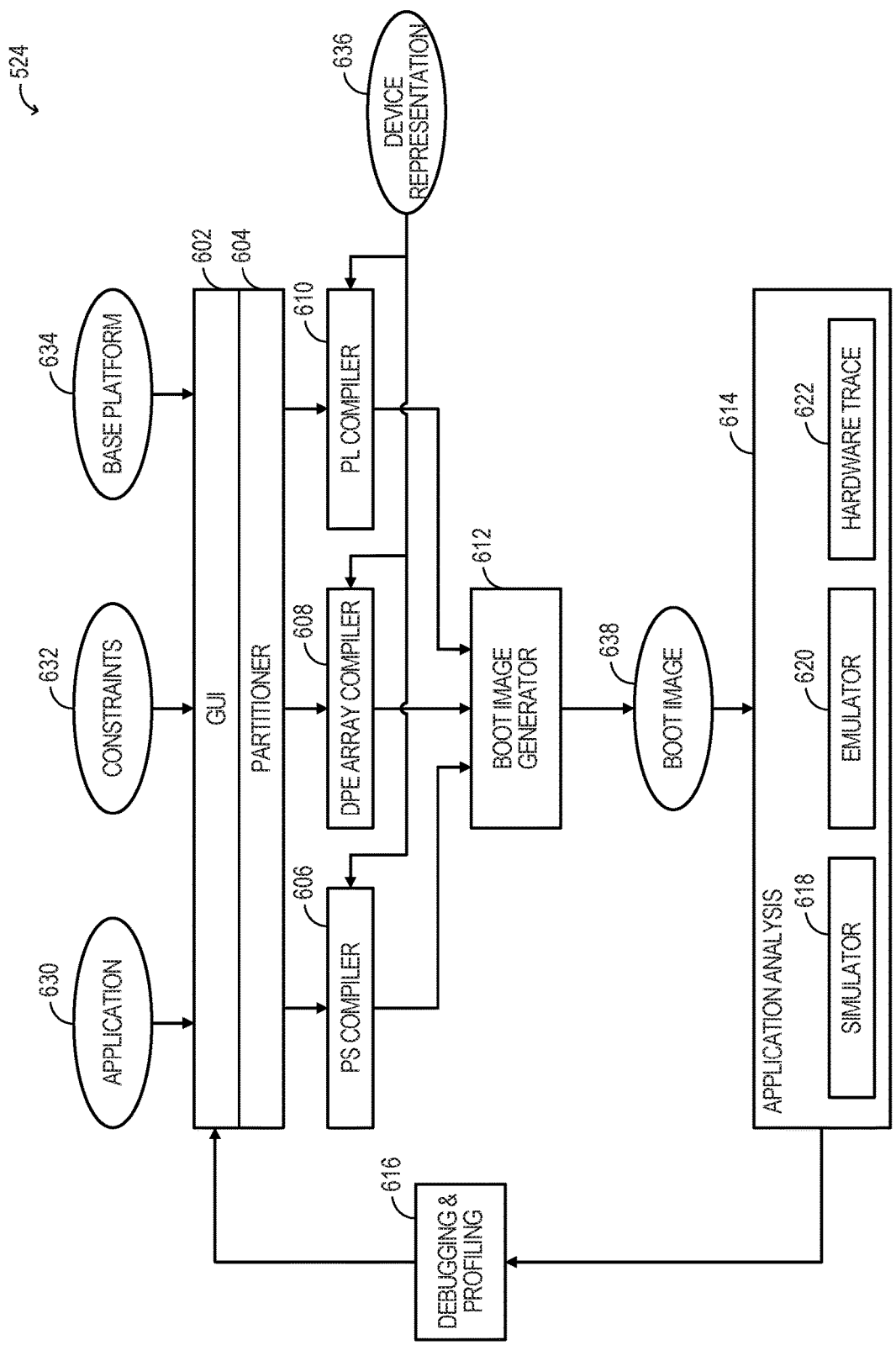
FIG. 6 is a block diagram depicting an application design tool capable of being implemented on the application design system of FIG. 5 according to some examples.

FIG. 6 is a block diagram depicting an application design tool 524 capable of being implemented on the application design system 500 of FIG. 5 according to some examples. The application design tool 524 includes a GUI module 602, a partitioner module 604, a PS compiler module 606, a DPE array compiler module 608, a PL compiler module 610, a boot image generator module 612, an application analysis module 614, and a debugging and profiling module 616. The application analysis module 614 includes a simulator module 618, an emulator module 620, and a hardware trace module 622. The modules 602-622 are just an example implementation of the application design tool 524. The functions performed by the modules 602-622 described herein can be performed by a different configuration of one or more modules in the application design tool 524. The modules 602-622 in the application design tool 524 can be implemented by circuitry that is part of the application design system 500, by firmware and/or software in the application design system 500, or by a combination thereof.

The GUI module 602 provides an interface, via the GUI 520 and IO devices 516, for example, for a user to create an application 630 (e.g., a user design). The application 630 can be a file including source code that defines the functionality of the application 630. The application 630 can be implemented according to a graph programming model. The application 630 can include kernel source code that defines kernels, and can define communication links (e.g., data flows) that link the kernels. The application 630 can be written in various types of object orientated programming languages (e.g., C++ or another language). An advantage of implementing a graph programming model for the application 630 is that a graph can have a highly parallelized architecture. In some examples, the semantics of the graph established by the application 630 is based upon the general theory of Kahn Process Networks which provides a computation model for deterministic parallel computation that is applied to the heterogeneous architecture in the SoC 100 (which includes different programmable architectures, e.g., the DPE array 102, the PS 104, and/or the PL 106).

Some constraints of the constraints file 632 can also be defined via the GUI module 602. The constraints can be user-defined, such as performance constraints and placement constraints, or pre-defined system constraints, such as constraints of the architecture like permissible number of data flows through a port of a stream switch based on a mode, etc. User-defined constraints can be defined via the GUI module 602, for example. The constraints of the constraints file 632 can restrict some functionality to be performed within a defined latency, can restrict where various kernels can be placed in relation to another kernel, can restrict in which subsystem (e.g., the DPE array 102, the PS 104, or the PL 106) functionality can be mapped, etc., for example.

A base platform 634 can be a pre-defined class library that defines various functions, application programming interfaces (APIs), etc. that can be used by the application 630 via the GUI module 602. The application 630 (e.g., graph) can use various objects defined in the class library to call functionality in the application 630.

After creating the application 630, the application 630, constraints file 632, and base platform 634 are passed to the partitioner module 604. The partitioner module 604 partitions functionality of the application 630 to the different subsystems (e.g., the DPE array 102, the PS 104, or the PL 106). The partitioner module 604 can parse the application, e.g., based on the objects that are used to define different functions of the application 630 to partition the application 630 to the different subsystems.

The partitioned functionality is passed to the PS compiler module 606, the DPE array compiler module 608, and the PL compiler module 610. In some examples, a compiler module may not be passed partitioned functionality if the application 630 does not include functionality to be mapped to the corresponding subsystem. The PS compiler module 606 compiles the functionality partitioned to the PS 104 and generates binaries from the compiling. The DPE array compiler module 608 compiles the functionality partitioned to the DPE array 102 (e.g., including mapping and routing) and generates binaries from the compiling. The PL compiler module 610 compiles the functionality partitioned to the PL 106 (e.g., including placing and routing) and generates a bitstream from the compiling. The compiling by any of the PS compiler module 606, the DPE array compiler module 608, and the PL compiler module 610 can be based on a device representation file 636 that is a logical representation of the architecture of the SoC 100, e.g., such that various functionality can be mapped or placed on elements of a given subsystem. The compiling by any of the PS compiler module 606, the DPE array compiler module 608, and the PL compiler module 610 can be iteratively performed based on the compiling of any other of the PS compiler module 606, the DPE array compiler module 608, and the PL compiler module 610. For example, to meet some constraints, mapped functionality within the DPE array 102 may be re-mapped based on the placement of logic within the PL 106 to meet timing constraints between the DPE array 102 and the PL 106.

The boot image generator module 612 assembles the binaries and bitstream from the compiler modules 606-610 in a boot image file 638. The boot image file 638 is assembled in a format that is capable of being read, loaded, and executed on the SoC 100. The boot image file 638 is capable of being read, loaded, and executed on, e.g., the SoC 100 to implement the application 630 on the SoC 100.

The application analysis module 614 is then capable of determining performance indicators of the boot image file 638 operating on the SoC 100. The simulator module 618 simulates the operation of the boot image file 638 on the SoC 100, and the emulator module 620 emulates the operation of the boot image file 638 on the SoC 100. The simulator module 618 can be a SystemC simulator, for example. The hardware trace module 622 is capable of, when communicatively coupled to the SoC 100, receiving trace information from the SoC 100 after the boot image file 638 has been loaded on the SoC 100 and the SoC 100 has performed operations according to the boot image file 638.

Results of the application analysis module 614 are passed to the debugging and profiling module 616. The debugging and profiling module 616 can parse the results from the application analysis module 614 and display, via the GUI module 602, various events and performance metrics indicated by the results. The user can view the events and performance metrics via the GUI module 602 and GUI 520 on the display 518, for example, and can responsively and iteratively modify the application 630.

Figure 7:
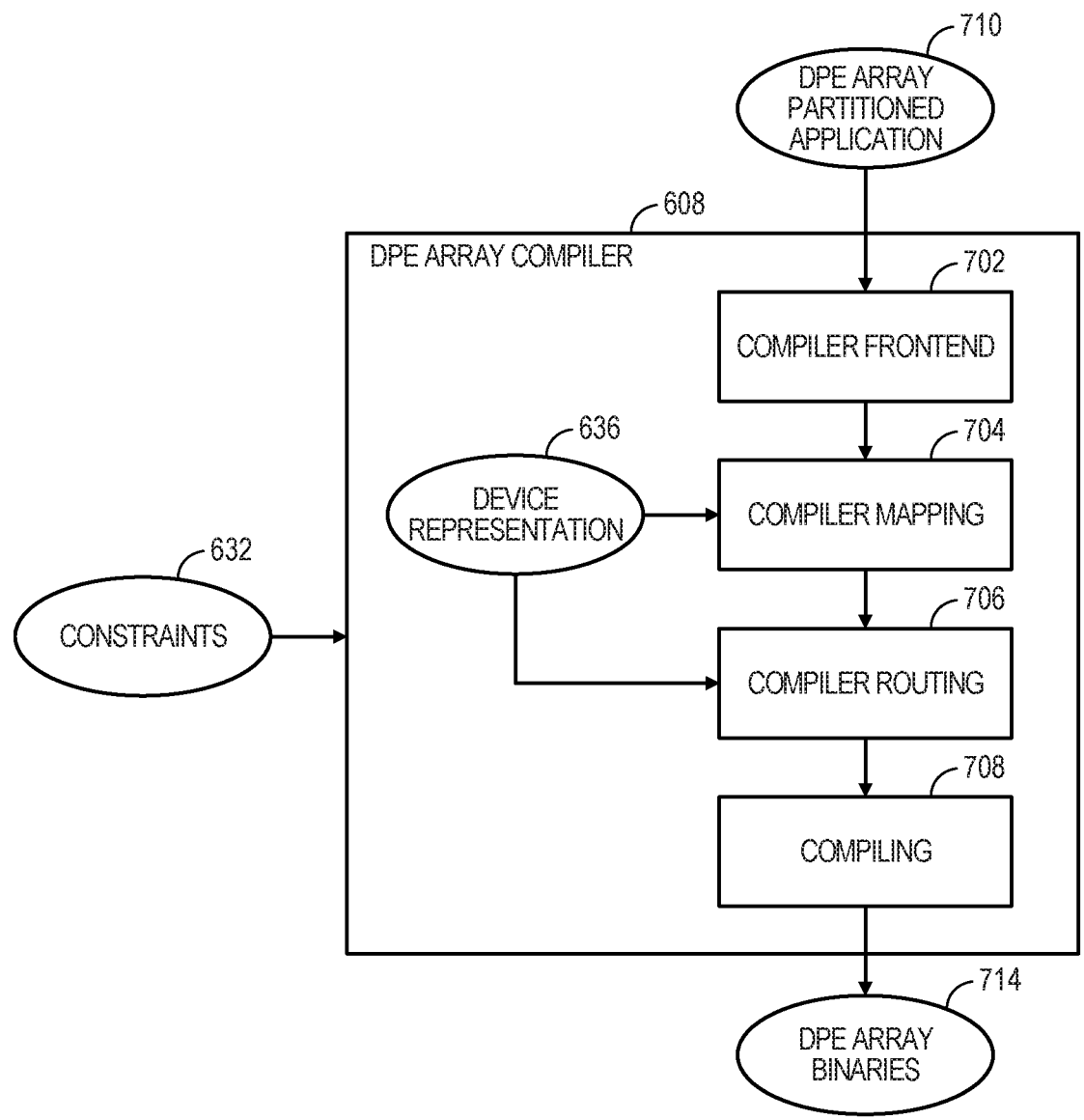
FIG. 7 is a block diagram depicting a DPE array compiler module of FIG. 6 according to some examples.

FIG. 7 is a block diagram depicting the DPE array compiler module 608 of FIG. 6 according to some examples. The DPE array compiler module 608 includes a compiler frontend module 702, a compiler mapping module 704, a compiler routing module 706, and a compiling module 708.

The DPE array compiler module 608 receives a DPE array partitioned application file 710 (e.g., a netlist) that includes kernels to be mapped to and instantiated on the DPE array 102. The DPE array partitioned application file 710 can be generated by the partitioner module 604 that partitions functionality of the application 630 to the different subsystems. The compiler frontend module 702 pre-processes the DPE array partitioned application file 710. For example, the processing can include identifying kernels that are to be mapped on different cores 202 of DPEs 114 and defining nets for edges between the kernels. The compiler frontend module 702 can generate a graph file (e.g., in a .json format) of the kernels and edges.

The compiler mapping module 704 maps kernels to cores 202 of DPEs 114 and maps input/output nodes of the DPE array 102 to tiles 118 of the SoC interface block 116. The compiler mapping module 704 uses the device representation file 636. Mapping by the compiler mapping module 704 identifies which elements in the device representation file 636 corresponding to the DPE array 102 will implement which kernels or other functionality. The compiler mapping module 704 may use the constraints file 632 to ensure that where kernels and input/output nodes are mapped comply with constraints identified in the constraints file 632.

Mapping kernels to cores 202 can include minimizing data movements such as by mapping the kernels to cores 202 that permit communication via shared memory in a memory module 204 between the cores 202. When communication via shared memory is permitted, mapping can also map buffers to memory banks in a memory module 204 for shared memory communications. In some examples where a group of kernels are repeated in an application (e.g., in the graph file), mapping can identify a cluster of kernels and map that cluster onto cores 202 of DPEs 114. The mapping of the cluster of kernels can then be replicated to cores 202 of other DPEs 114 to map the kernels of the application. Mapping of input/output nodes to tiles 118 can include an iterative process communicating with the PL compiler module 610 and/or PS compiler module 606. For example, where input/output nodes are to be mapped to tiles 118 may correspond to a location where logic is placed and routed within the PL 106. Hence, coordination between the DPE array compiler module 608 and PL compiler module 610 may occur when placing logic in the PL 106 and/or mapping input/output nodes to tiles 118 of the SoC interface block 116 of the DPE array 102.

The compiler mapping module 704 creates a mapped array file having kernels mapped to various cores 202 of DPEs 114 and input/output nodes mapped to various tiles 118, and can create a netlist of nets for edges between the kernels and/or input/output nodes. The mapped array file and netlist are output by the compiler mapping module 704 to the compiler routing module 706.

The compiler routing module 706 generates routes for nets (e.g., for edges) through the stream network of the DPE array 102, including through stream switches 220 of DPEs 114 and stream switches 302 of tiles 118. The compiler routing module 706 uses the device representation file 636 in generating the routes. The routing can be for data streams of application data, for DMA streams between DPEs 114, or for other data streams. The routes can be between various different cores 202 on which kernels are mapped, between various cores 202 on which kernels are mapped and memory modules 204 in different DPEs 114 (e.g., for DMA streams), between cores 202 on which kernels are mapped and mapped input/output nodes of tiles 118, and/or between other elements in the DPE array 102. The compiler routing module 706 may use the constraints file 632 to ensure that routes comply with constraints identified in the constraints file 632. Routing by the compiler routing module 706 and mapping by the compiler mapping module 704 may be iteratively performed to optimize a solution and/or to ensure compliance with constraints of the constraints file 632. The compiler routing module 706 generates a translated netlist that includes the generated routes.

The compiling module 708 generates an executable DPE array binaries file 714 based on the processing by the compiler frontend module 702, the mapping by the compiler mapping module 704, and the routing by the compiler routing module 706. For example, the compiling module 708 may use the graph file, the mapped array file, and the translated netlist to compile binaries that are stored in the executable DPE array binaries file 714. The compiling module 708 can generate packet identifications (IDs) for data streams as described below. The executable DPE array binaries file 714 is capable of being loaded into the DPE array 102 and executed by DPEs 114 and tiles 118 in the DPE array 102. The executable DPE array binaries file 714 can be used to form the boot image file 638 of FIG. 6.

Figure 8:
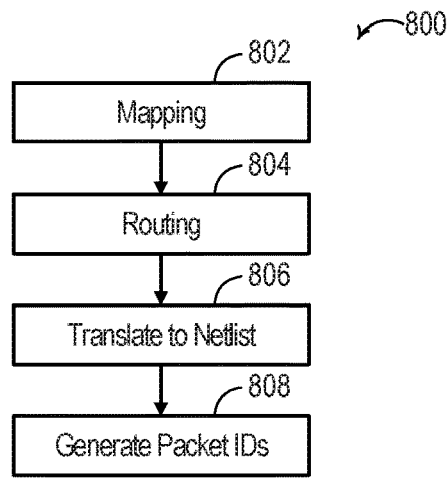
FIG. 8 is a flowchart of a method for compiling functionality of an application for a DPE array according to some examples.

FIG. 8 is a flowchart of a method 800 for compiling functionality of an application for a DPE array according to some examples. The method 800 may be performed by the DPE array compiler module 608 of FIG. 6, and any of the modules 702-708 of the DPE array compiler module 608 in FIG. 7 can perform one or more of the operations of the method 800.

In block 802, mapping is performed. Mapping can include global mapping followed by detailed mapping. Mapping using global mapping and detailed mapping can reduce search spaces for mapping nodes of the graph to components of the architecture of the DPE array 102. The global mapping can map kernels (e.g., clusters of kernels in a partitioned netlist) to cores 202 of DPEs 114, input/output nodes to tiles 118 of the DPE array 102, and buffers to memory modules 204 of DPEs 114. The global mapping can be based on multiple considerations. Detailed mapping can include mapping buffers in specified memory banks 212 in the memory module 204 of the DPE 114 designated by the global mapping, and can include mapping inputs/outputs to specified ports of the stream switch 302 in the tile 118 designated by the global mapping for input/output interfaces of the DPE array 102. The mapping in block 802 may be performed by the compiler mapping module 704 or another module. Mapping may be performed using an Integer Linear Programming (ILP) algorithm, a Boolean satisfiability problem (SAT) algorithm, and/or the like.

In block 804, routing is performed. The routing can generate routes logical nets that are to be implemented by data streams in the stream network, such as for DMAs and other data streams. The routing can include a global routing that identifies through which stream switches 220, 302 of DPEs 114 or tiles 118 the routes are formed, and a detailed routing that identifies the ports in the stream switches 220, 302 that forms the route. The routing, e.g., global and/or detailed routing, can include using SAT algorithm, an ILP algorithm, a PathFinder algorithm, a greedy algorithm, and/or the like. The routing in block 804 may be performed by the compiler routing module 706 or another module.

In block 806, the mapped elements and routes are translated to a netlist. The netlist can then be used for compiling, e.g., by the compiling module 708, of the DPE partitioned application file 710 to generate the executable DPE array binaries file 714.

In block 808, packet IDs are generated for data streams. The packet IDs are generated based on the logical nets and routes generated in block 804 and are used, in operation of the SoC 100, to route packet-switched streams along the generated routes by stream switches 220, 302. The packet IDs can be included in the executable DPE array binaries file 714, which can be written to configuration registers and/or program memory of DPEs for appending to data in packet-switched streams.

Figure 9:
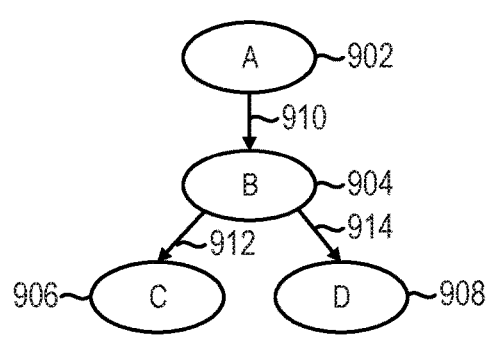
FIG. 9 depicts a simple partitioned application for mapping on a DPE array according to some examples.
Figure 10:
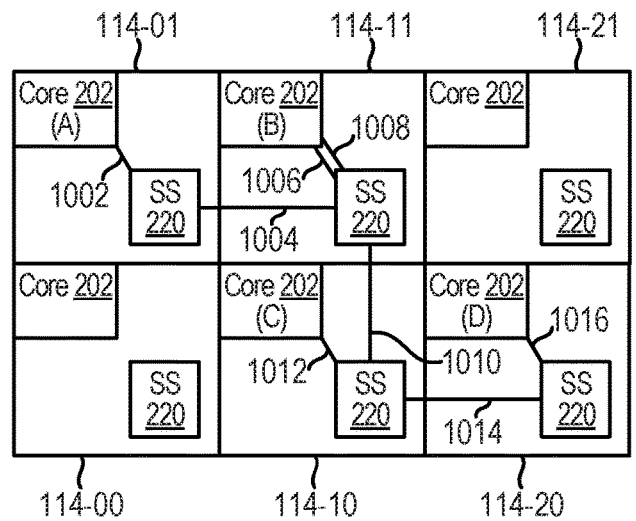
FIG. 10 depicts the partitioned application of FIG. 9 mapped on a portion of a DPE array according to some examples.

FIGS. 9 and 10 illustrate a simple partitioned application for mapping on a DPE array 102 and the partitioned application mapped on a portion of a DPE array 102 according to some examples. The partitioned application of FIG. 9 includes kernel A 902, kernel B 904, kernel C 906, and kernel D 908. Edge 910 (e.g., a logical net routed as a data stream) is from kernel A 902 to kernel B 904. Edge 912 (e.g., a logical net routed as a data stream) is from kernel B 904 to kernel C 906. Edge 914 (e.g., a logical net routed as a data stream) is from kernel B 904 to kernel D 908. Assume that edge 910 utilizes one hundred percent of the hardware resources of its route (e.g., one hundred percent of the capacity of the port handlers 402 through which the data stream is routed is utilized). Also, assume that edge 912 utilizes twenty percent of the hardware resources of its route, and edge 914 utilizes thirty percent of the hardware resources of its route.

FIG. 10 illustrates DPEs 114-00, 114-10, 114-20, 114-01, 114-11, 114-21, each with a core 202 and stream switch 220. In this example, kernel A 902 is mapped to core 202 of DPE 114-01; kernel B 904 is mapped to core 202 of DPE 114-11; kernel C 906 is mapped to core 202 of DPE 114-10; and kernel D 908 is mapped to core 202 of DPE 114-20. Each edge 910, 912, 914 is routed as a packet-switched stream for illustration of aspects of examples. Edge 910 is routed from the core 202 of DPE 114-01 to the stream switch 220 of DPE 114-01 by connection 1002, from the stream switch 220 of DPE 114-01 to the stream switch 220 of DPE 114-11 by connection 1004, and from the stream switch 220 of DPE 114-11 to the core 202 of DPE 114-11 by connection 1006. Since edge 910 is assumed to utilize one hundred percent of the hardware resources of the route, edge 910 does not share the hardware resources with another edge.

Edge 912 is routed from the core 202 of DPE 114-11 to the stream switch 220 of DPE 114-11 by connection 1008, from the stream switch 220 of DPE 114-11 to the stream switch 220 of DPE 114-10 by connection 1010; and from the stream switch 220 of DPE 114-10 to the core 202 of DPE 114-10 by connection 1012. Edge 914 is routed from the core 202 of DPE 114-11 to the stream switch 220 of DPE 114-11 by connection 1008, from the stream switch 220 of DPE 114-11 to the stream switch 220 of DPE 114-10 by connection 1010, from the stream switch 220 of DPE 114-10 to the stream switch 220 of DPE 114-20 by connection 1014, and from the stream switch 220 of DPE 114-20 to the core 202 of DPE 114-20 by connection 1016. Since edges 912, 914 are assumed to cumulatively utilize less than one hundred percent of the hardware resources of the routes, edges 912, 914 are capable of sharing hardware resources, such as respective port handlers 402 of stream switches 220 of DPEs 114-11, 114-10 and connections 1008, 1010. Sharing of hardware resource by routes can be accomplished by a packet-switching operation of the stream switches 220 by implementing packet IDs to indicate a route along which the packets are to be routed.

In some examples, the number of packet IDs available for an application may be constrained, e.g., by the bits available in a packet header for a packet ID. In some examples, five bits are available for a packet ID such that thirty-two ($2^5$) packet IDs are available for assignment to a packet-switched stream. For simple applications, each packet-switched stream can be assigned a unique packet ID for routing, such as when the number of packet-switched streams is equal to or less than the number of packet IDs that are available for assignment. For more complex applications, any given packet ID may be assigned to multiple packet-switched streams, such as when the number of packet-switched streams exceeds the number of packet IDs that are available for assignment.

Generally, in examples described below, an interference graph is constructed based on the logical nets and routes of packet-switched streams that were generated by the routing of block 804, and vertex coloring is performed on the interference graph to assign packet IDs. Vertex coloring can be an NP-Hard problem and can be a polynomial time heuristic algorithm. In simpler instances, a straight-forward approach including constructing the interference graph and vertex coloring is implemented, such as when the interference of packet-switched streams as represented by the interference graph is low such that the vertices can be colored with a number of colors that is less than the number of available packet IDs without modifying the constructed interference graph. Examples described below accommodate for the possibility of high interference. Some examples can reduce interference by logically splitting routes, and hence, the corresponding vertices, which can be implemented through using nested packet IDs. Some examples can reduce interference by physically splitting routes, and hence, the corresponding vertices, which can be implemented by inserting a DMA engine to segregate segments of the split route. In some examples, constraints can be implemented in the mapping and/or routing of blocks 802, 804 that can prevent high interference of packet-switched streams, which can obviate splitting routes.

Figure 11:
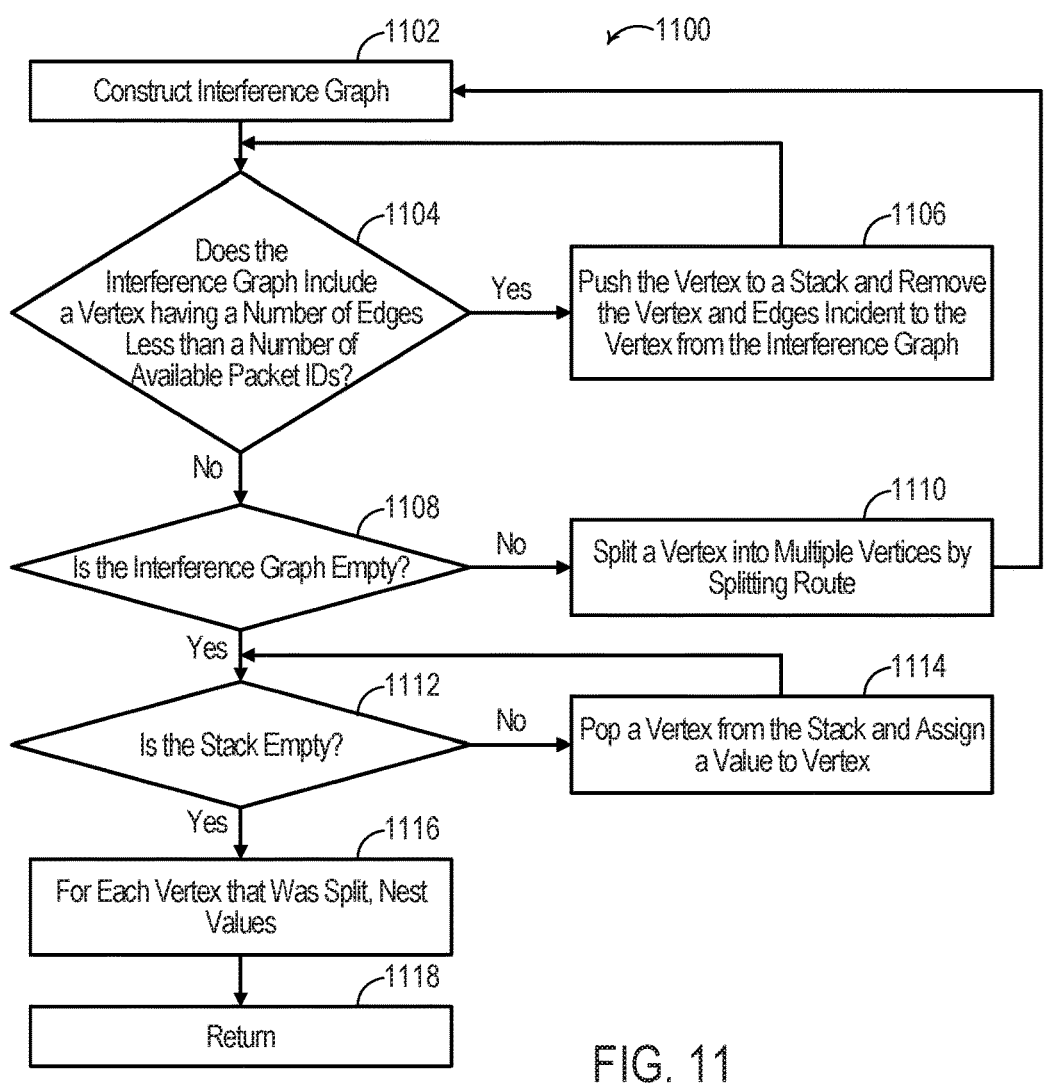
FIG. 11 is a flowchart of a method for assigning packet identifications (IDs) according to some examples.

FIG. 11 is a flowchart of a method 1100 for assigning packet IDs according to some examples. The method 1100 accommodates for the possibility of high interference by permitting logically splitting routes and vertices and by implementing nested packet IDs for split routes and vertices.

In block 1102, an interference graph is constructed based on the logical nets and routes of packet-switched streams that were generated by the routing of block 804. The interference graph includes vertices that are connected by interference edges. The vertices represent logical nets routed to have packet-switched streams routed in the DPE array 102. Each interference edge connects the vertices that represent logical nets of packet-switched streams that share a port of a stream switch in the DPE array 102. The interference graph can be generated using any appropriate algorithm, such as a greedy algorithm. Upon constructing an interference graph in an initial iteration, a stack can be initialized. Depending on the implementation, subsequent iterations may include clearing a previous stack from a previously constructed interference graph, as described below.

Figure 12:
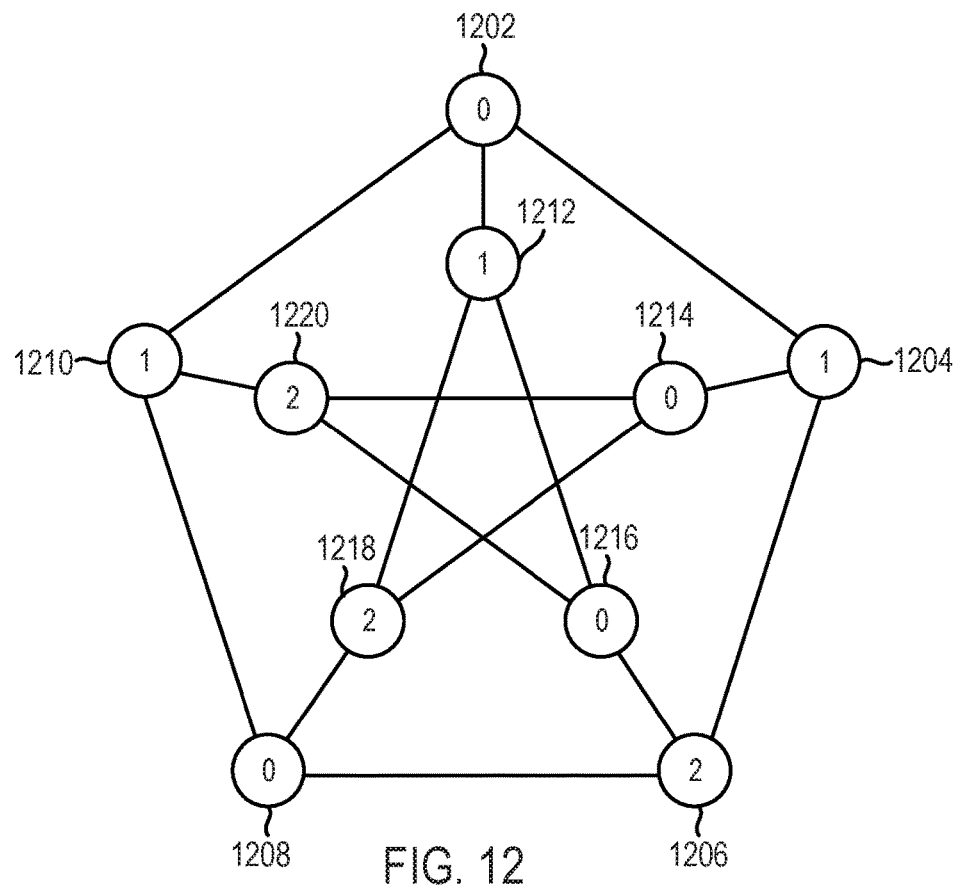
FIG. 12 depicts an example interference graph according to some examples.

FIG. 12 is an example interference graph to illustrate aspects according to some examples. The interference graph includes vertices 1202, 1204, 1206, 1208, 1210, 1212, 1214, 1216, 1218, 1220, each of which represents a logical net of a packet-switched stream. The packet-switched stream (and corresponding logical net) represented by vertex 1202 shares at least one port of a stream switch with each of the packet-switched streams (and corresponding logical nets) represented by vertices 1204, 1210, 1212, as indicated by the respective interference edges connecting the vertex 1202 to vertices 1204, 1210, 1212. Similarly, other packet-switched streams (and corresponding logical nets) represented by the vertices share at least one port of a stream switch with other packet-switched streams as indicated by the interference graph.

Referring back to FIG. 11, in block 1104, a determination is made whether the interference graph constructed in the preceding block 1102 includes a vertex having a number of interference edges incident thereto that is less than a number of available packet IDs. For example, the determination of block 1104 determines whether the interference graph includes a vertex having a degree less than the number of available packet IDs. If block 1104 determines such a vertex is present, in block 1106, the vertex that has a number of interference edges less than the number of available packet IDs is pushed to the stack and is removed from the interference graph, as also are the interference edges incident to the vertex. From block 1106, operation of the method 1100 loops back to block 1104, and the loop continues until the interference graph does not include a vertex having a number of interference edges incident thereto that is less than a number of available packet IDs as determined in block 1104.

If the determination in block 1104 is that the graph does not include such a vertex, in block 1108, a determination is made whether the interference graph is empty. If the graph is empty, each vertex that was constructed in the interference graph in the preceding block 1102 had sufficiently low interference to permit assigning packet IDs without splitting a vertex by splitting a route (to reduce interference). If the determination of block 1108 determines that the interference graph is not empty, in block 1110, a vertex is split into multiple vertices by splitting the route corresponding to the vertex. The vertex that is identified for splitting can be any vertex that remains in the interference graph. In some examples, the vertex that is identified for splitting can be the vertex that has the largest number of interference edges incident thereto, which indicates that the vertex has the largest interference. In some examples, the vertex that is identified for splitting does not represent a broadcast packet-switched stream since splitting a broadcast packet-switched stream can result in more complicated assignment of packet IDs, such as by having to configure multiple stream switches for each split of the route. The vertex can be split into any number of vertices, and the route can be split into any number of corresponding segments. The route can be split into a route segment, for example, by, beginning at the source or where a preceding route segment ends, traversing the route and splitting the route prior to a location along the route segment where the number of interferences along the route segment cumulates to be equal to the number of available packet IDs. The splitting of a route in this example is a logical splitting, which is implemented by nesting packet IDs as described in more detail below.

After splitting a vertex into multiple vertices in block 1110, operation of the method 1100 loops back to block 1102 where an interference graph is constructed with the split multiple vertices. In some examples, constructing the interference graph re-constructs portions of the previously constructed interference graph that is affected by splitting the vertex in block 1110 (e.g., vertices that remain in the interference graph), which can permit maintaining the stack with any pushed vertices. In some examples, constructing the interference graph can clear the stack that was previously initialized and used for the previously constructed interference graph, and a new interference graph can be constructed. After constructing the interference graph in block 1102, the loop of blocks 1104, 1106 ("inner loop") is performed as previously described. The loop of blocks 1102, 1108, 1110 and the inner loop ("outer loop") is performed until an interference graph has been constructed such that each vertex has a number of interference edges incident thereto that is less than the number of available packet IDs, which results in each vertex being pushed to the stack by operation of the inner loop of blocks 1104, 1106 until the interference graph is empty as determined in block 1108. This can include performing any number of iterations of the outer loop, including no iterations, to split vertices to reduce interference of any vertex.

When the determination of block 1108 is that the interference graph is empty (because each vertex was pushed to the stack and removed from the interference graph in block 1106), in block 1112, a determination is made whether the stack is empty. If the stack is not empty as determined in block 1112, a vertex is popped from the stack and assigned a value (e.g., a "color") in block 1114, and operation of the method 1100 loops back to block 1112. Hence, a loop is performed by blocks 1112, 1114 that pops each vertex from the stack and assigns a value to each vertex. The value that is assigned to a vertex is or corresponds to the packet ID that the packet-switched stream corresponding to the vertex is assigned. The value that is assigned to a given vertex is, for example, the lowest value in the available range of values (e.g., available range of packet IDs) that can be assigned such that the assigned value is not equal to a value assigned to any neighboring vertex connected to the given vertex by an interference edge. Referring to FIG. 12 as an example, if vertex 1202 is the first vertex popped from the stack, no other values have been assigned, so vertex 1202 is assigned value '0'. If vertex 1204 is the next vertex popped from the stack, vertex 1204 is connected to vertex 1202 by an interference edge, so the lowest value that can be assigned that is not equal to a value assigned to a neighboring vertex (e.g., vertex 1202) is value '1'.

In FIG. 12, each vertex is assigned a value (e.g., a "color"). Generally, the vertex coloring assigns values (e.g., "colors") to each vertex such that no two vertices connected by an interference edge are the same value. Each value corresponds to a packet ID, and hence, each logical net (and corresponding packet-switched stream) that is represented by a vertex that is assigned a given value is assigned a packet ID corresponding to the value. Any packet ID can be assigned to multiple packet-switched streams. In some examples, not all packet IDs are assigned to a vertex or a corresponding packet-switched stream.

Referring back to FIG. 11, if block 1112 determines that the stack is empty, in block 1116, for each vertex that was split (in block 1110), the values that were assigned to the multiple vertices corresponding to the respective split vertex are nested in order along the corresponding route. In block 1118, the method 1100 returns.

Figure 13:
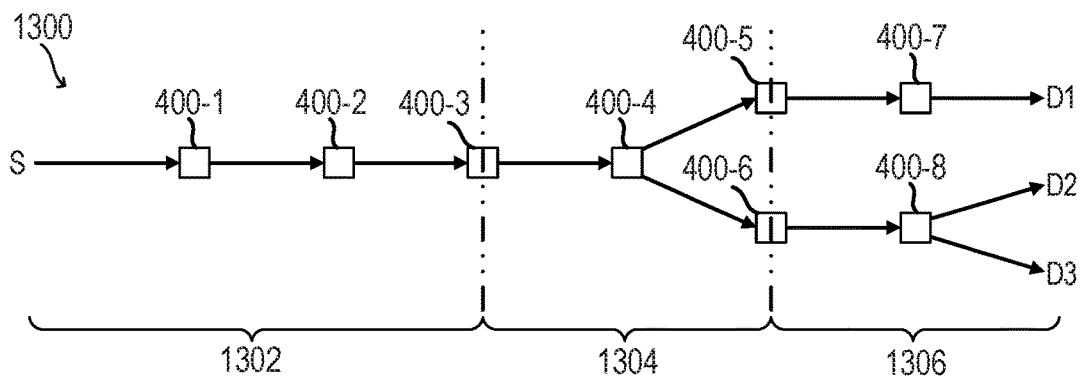
FIG. 13 is a packet-switched stream illustrating aspects of nesting values according to some examples.

FIG. 13 illustrates a broadcast (e.g., one-to-many) packet-switched stream 1300 to illustrate aspects of nesting values of block 1116 in the method 1100 of FIG. 11 according to some examples. A person having ordinary skill in the art will readily understand how to apply these aspects to a one-to-one packet-switched stream. As illustrated in FIG. 13, the packet-switched stream 1300 is routed from source S through stream switches 400-1, 400-2, 400-3, 400-4, 400-5, 400-6, 400-7, 400-8 to destinations D1, D2, D3. The packet-switched stream 1300 is split into a first route segment 1302, a second route segment 1304, and a third route segment 1306 by block 1110 in operation of the method 1100 of FIG. 11. The first route segment 1302 is assigned an ID1; the second route segment 1304 is assigned an ID2; and the third route segment 1306 is assigned an ID3.

As stated above, a packet-switched stream can include a packet header including a packet ID, a data segment (or data payload) following the packet header, and an end of message indication following the data segment. This can be generally noted as Header(ID)[Data, End]. When nesting packet headers, and hence, packet IDs, any nested packet header is treated as part of the data segment for the preceding packet header. Hence, nesting packet IDs for a packet-switched stream on the packet-switched stream 1300 of FIG. 13 has the format as Header (ID1)[Header(ID2)[Header(ID3)[Data, End]]] when the packet-switched stream is transmitted from the source S.

The packet-switched stream is routed based on ID1 through stream switches 400-1, 400-2. At stream switch 400-3, the packet-switched stream can be routed based on ID1 or ID2, and the stream switch 400-3 is configured to remove the packet header of the packet-switched stream. Removing the packet header of the packet-switched stream at stream switch 400-3 removes the packet header that includes ID1 and exposes the packet header that includes ID2 that was previously treated as part of the data payload. In some examples, the output port handler 402 of the stream switch 400-3 is configured to remove the packet header. Routing of the packet-switched stream at stream switch 400-4 is based on ID2.

At stream switches 400-5, 400-6, the packet-switched stream can be routed based on ID2 or ID3, and the stream switches 400-5, 400-6 are configured to remove the packet header of the packet-switched stream. Removing the packet header of the packet-switched stream at stream switches 400-5, 400-6 removes the packet header that includes ID2 and exposes the packet header that includes ID3 that was previously treated as part of the data payload. In some examples, the output port handler 402 of each stream switch 400-5, 400-6 is configured to remove the packet header. Routing of the packet-switched stream at stream switches 400-7, 400-8 is based on ID3.

Although the route in the third route segment 1306 is two physically separate routes, the third route segment 1306 (with the two physically separate routes) are a same logical net, and hence, can be represented by a single vertex in an interference graph. Accordingly, the physically separate routes in the third route segment 1306 can be assigned a same packet ID. This can permit nesting of headers for the packet-switched stream 1300. In other examples, the physically separate routes may be treated as different logical nets and represented by separate vertices.

Figure 14:
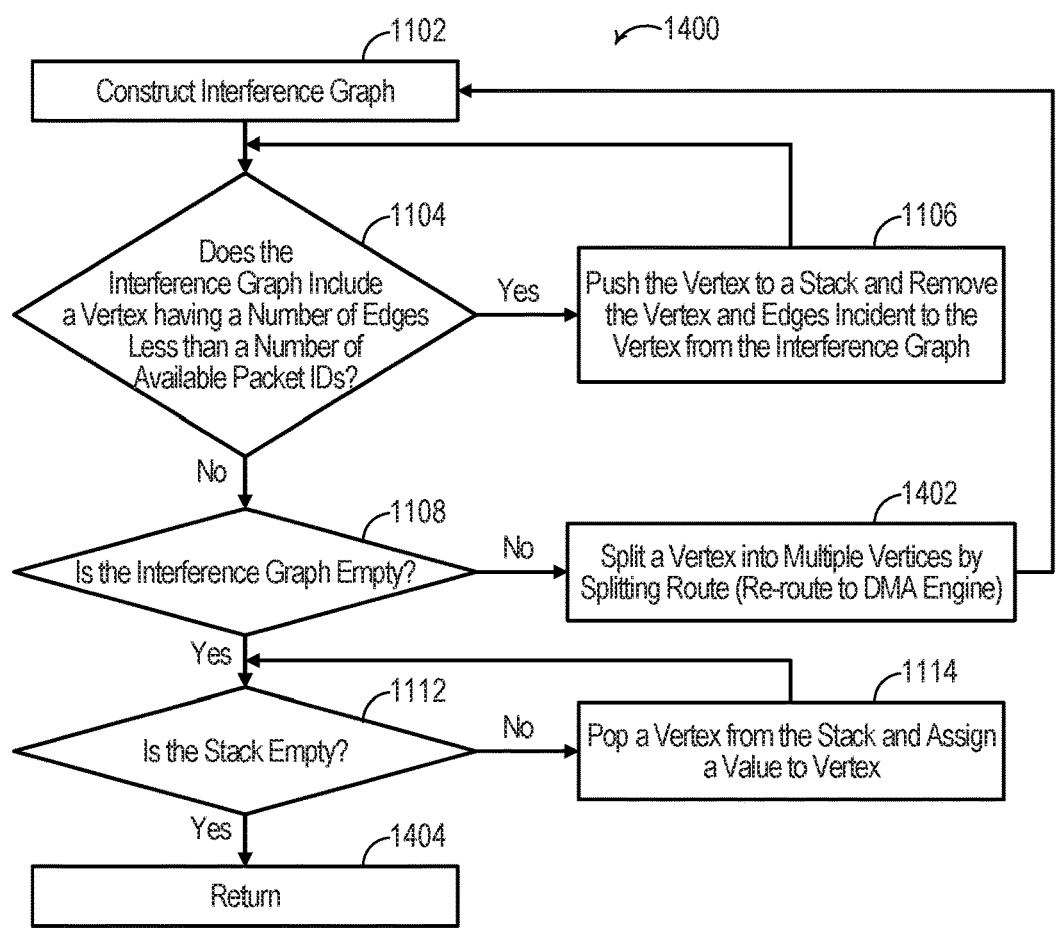
FIG. 14 is a flowchart of a method for assigning packet IDs according to some examples.

FIG. 14 is a flowchart of a method 1400 for assigning packet IDs according to some examples. The method 1400 accommodates for the possibility of high interference by permitting physically splitting routes and vertices by inserting a DMA engine for a split route and vertex. In the method 1400, blocks 1102-1108 proceed as described above with respect to the method 1100 of FIG. 11. If block 1108 determines that the interference graph is not empty, in block 1402, a vertex is split into multiple vertices by splitting the route corresponding to the vertex by re-routing the route to a DMA engine. The identification of a route can be like described for block 1110 of FIG. 11. The splitting of a route in this example is a physical, as opposed to logical, route splitting by changing a route to terminate and then to resume again at a DMA engine where the route is split. This decouples the route segments of the routes that are split. Additional details are described below.

The outer loop that includes block 1402 can be performed as described above in the context of FIG. 11 with block 1110 instead of block 1402. The loop of blocks 1112, 1114 is performed as described above in the context of FIG. 11. When block 1112 determines that the stack is empty, in block 1404, the method 1400 returns.

Figure 15:
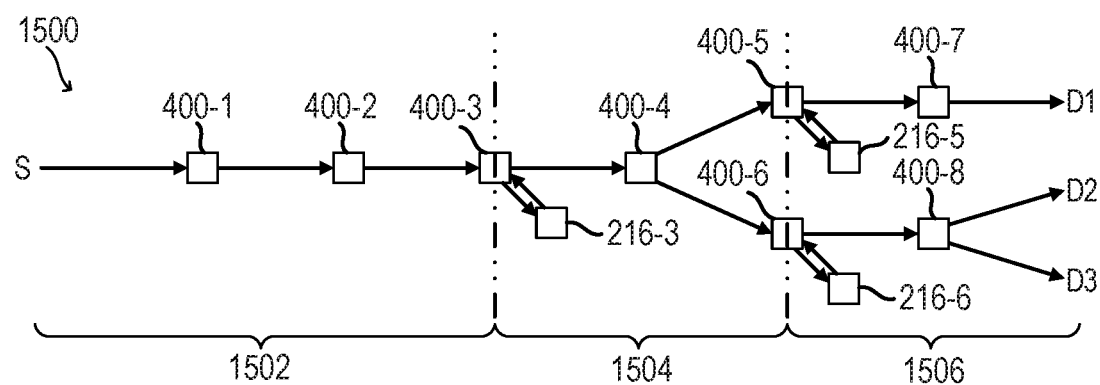
FIG. 15 is a packet-switched stream illustrating aspects of splitting a route using a direct memory access (DMA) engine according to some examples.

FIG. 15 illustrates a broadcast (e.g., one-to-many) packet-switched stream 1500 to illustrate aspects of splitting a route using a DMA engine in block 1402 in the method 1400 of FIG. 14 according to some examples. A person having ordinary skill in the art will readily understand how to apply these aspects to a one-to-one packet-switched stream. Like in FIG. 13, the un-split packet-switched stream 1500 is routed from source S through stream switches 400-1 through 400-8 to destinations D1, D2, D3. The un-split packet-switched stream 1500 is split into a first route segment 1502, a second route segment 1504, and a third route segment 1506 by block 1402 in operation of the method 1400 of FIG. 14. The first route segment 1502 begins at the source S and, at stream switch 400-3 is routed to DMA engine 216-3 to terminate the first route segment 1502. The second route segment 1504 begins at the DMA engine 216-3 and, at stream switches 400-5, 400-6 is routed to DMA engines 216-5, 216-6, respectively, to terminate the second route segment 1504. The third route segment 1506 begins at the DMA engines 216-5, 216-6 and terminates at the destinations D1, D2, D3.

The first route segment 1502 is assigned an ID1; the second route segment 1504 is assigned an ID2; and the third route segment 1506 is assigned an ID3. The DMA engine 216-3 is configured to prepend a packet header including ID2 for transmission of the packet-switched stream along the second route segment 1504. The output port handler 402 of the stream switch 400-3 can strip the packet header including ID1 from the packet-switched stream that is generated at the source S and transmitted along the first route segment 1502 before the stream is transmitted to the DMA engine 216-3. The DMA engines 216-5, 216-6 are configured to prepend a packet header including ID3 for transmission of the packet-switched stream along the third route segment 1506 to the destinations D1, D2, D3. The output port handlers 402 of the stream switches 400-5, 400-6 can strip the packet header including ID2 from the packet-switched stream that is transmitted along the second route segment 1504 before the stream is transmitted to the respective DMA engines 216-5, 216-6.

Although the route in the third route segment 1506 is two physically separate routes, the third route segment 1506 (with the two physically separate routes) are a same logical net, and hence, can be represented by a single vertex in an interference graph. Accordingly, the physically separate routes in the third route segment 1506 can be assigned a same packet ID. In other examples, the physically separate routes may be treated as different logical nets and represented by separate vertices. Prepending packet headers using a DMA engines can more easily enable assigning different packet IDs to the different physically separate routes in the third route segment 1506.

In some examples, inserting a DMA engine 216 to split a route can include mapping a buffer to a memory bank 212 in the memory module 204 in which the DMA engine 216 is disposed. Mapping a buffer to a memory bank 212 may cause the mapping of block 802 and/or routing of block 804 of the method 800 of FIG. 8 to be performed again. In some scenarios, splitting a route by inserting a DMA engine 216 and mapping a buffer may result in an infeasible solution or an un-optimized solution. Hence, mapping and routing at blocks 802, 804 can be performed again to determine a feasible solution that complies with any constraints and that has been optimized. The mapping and routing at blocks 802, 804 and the method 1400 of FIG. 14 (as block 808 in FIG. 8) can be iteratively performed.

As will be appreciated by one having ordinary skill in the art, some examples disclosed herein may be embodied as a system, method, or computer program product. Accordingly, aspects may take the form of an entirely hardware embodiment, an entirely software embodiment (including firmware, resident software, micro-code, etc.), or a combination of software and hardware aspects. Furthermore, aspects may take the form of a computer program product embodied in one or more non-transitory computer readable storage medium(s) having computer readable program instruction code embodied thereon. A computer readable storage medium may be or include a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing.

Computer program instruction code for carrying out operations for aspects described herein may be written in any combination of one or more programming languages, including an object oriented programming language such as Java, Smalltalk, C++ or the like and conventional procedural programming languages, such as the C programming language or similar programming languages. The program instruction code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of various examples have been described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, can be implemented by computer program instruction code. These computer program instruction code may be provided to a processor of a general purpose computer, special purpose computer, or other programmable data processing apparatus to produce a machine, such that the program instruction code, which execute via the processor of the computer or other programmable data processing apparatus, create means for implementing the functions/acts specified in the flowchart and/or block diagram block or blocks.

These computer program instruction code may also be stored in a computer readable medium that can direct a computer, other programmable data processing apparatus, or other devices to function in a particular manner, such that the program instruction code stored in the computer readable medium produce an article of manufacture including program instruction code which implement the function/act specified in the flowchart and/or block diagram block or blocks.

The computer program instruction code may also be loaded onto a computer, other programmable data processing apparatus, or other devices to cause a series of operational steps to be performed on the computer, other programmable apparatus or other devices to produce a computer implemented process such that the program instruction code which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods, and computer program products according to various examples. In this regard, each block in the flowchart or block diagrams may represent a module, segment, or portion of program instruction code, which comprises one or more executable program instruction code for implementing the specified logical function(s). In some implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer program instruction code.

While the foregoing is directed to specific examples, other and further examples may be devised without departing from the basic scope thereof, and the scope thereof is determined by the claims that follow.

What is claimed is:

1. A design system comprising:
 a processor; and
 a memory coupled to the processor, the memory storing instruction code, the processor being configured to execute the instruction code to:
  generate routes of logical nets through switches of digital processing engines (DPEs) in a routing network, wherein each of the logical nets is formed between two kernels of an application, and wherein the kernels are mapped to the DPEs;
  construct an interference graph based on the routes, the interference graph comprising vertices and interference edges, each of the vertices representing one of the logical nets for which a route was generated, each of the interference edges connecting two vertices that represent a corresponding two logical nets that have corresponding routes that share at least one port of a switch of the switches;
  split a first route of the routes into route segments based on determining that a number of the interference edges associated with a first vertex of the vertices is less than a number of identifications, wherein the first route is associated with the first vertex; and
  assign the identifications to the routes comprising performing vertex coloring of the vertices of the interference graph, the identifications corresponding to values assigned to the vertices by the vertex coloring, wherein data streams are transmitted along the routes based on the identifications, and wherein a first one of the identifications assigned to the first route includes nested identifications associated with the route segments.

2. The design system of claim 1, wherein the processor being configured to execute the instruction code to construct the interference graph and assign the identifications to the routes comprising performing vertex coloring is further configured to execute the instruction code to:
iteratively, until the interference graph is empty:
construct the interference graph;
iteratively, while the interference graph includes a vertex having a number of interference edges incident on the vertex that is less than a number of available identifications, push the vertex to a stack and remove the pushed vertex and the interference edges incident on the pushed vertex from the interference graph; and if the interference graph is not empty, split a route of a logical net that corresponds to a vertex remaining in the interference graph into route segments; and
iteratively, until the stack is empty, pop a popped vertex from the stack and assign the popped vertex a lowest value that does not equal a value assigned to any vertex that is connected to the popped vertex by an interference edge in the interference graph.

3. The design system of claim 2, wherein the processor being configured to execute the instruction code to construct the interference graph and assign the identifications to the routes comprising performing vertex coloring is further configured to execute the instruction code to:
for each route that was split, nest identifications of respective route segments in order of the respective route segments along the respective route that was split.

4. The design system of claim 2, wherein the processor being configured to execute the instruction code to split a route of a logical net into route segments is further configured to execute the instruction code to:
insert between consecutive route segments an engine configured to insert into a data message an identification for the following route segment.

5. The design system of claim 1, wherein the processor being configured to execute the instruction code to assign the identifications to the routes comprising performing vertex coloring is further configured to execute the instruction code to:
push the vertices of the interference graph to a stack; and
iteratively, until the stack is empty, pop a vertex from the stack and assign the vertex a lowest value that does not equal a value assigned to any vertex that is connected to the vertex by an interference edge in the interference graph.

6. The design system of claim 1, wherein the routes are packet-switched routes, and each of the identifications is a packet identification in a packet header of one of the data streams to be transmitted along a respective packet-switched route.

7. The design system of claim 1, wherein the processor is further configured to execute the instruction code to:
map the kernels of the application to cores of the DPEs in a DPE array, wherein the switches are stream switches and each of the DPEs in the DPE array further including a stream switch of the stream switches that is connected to form at least part of the routing network, at least some of the routes being to, from, or between cores on which kernels are mapped.

8. The design system of claim 1, wherein the switches are interconnected stream switches forming at least a portion of the routing network, the stream switches being in respective ones of the DPEs, each of the DPEs further including a core and a memory module.

9. A method for compiling an application for a programmable device, the method comprising:
using a processor-based system:
generating routes of logical nets through switches of digital processing engines (DPEs) in a routing network, wherein each of the logical nets is formed between two kernels of kernels of an application, and wherein the kernels are mapped to the DPEs;
constructing an interference graph based on the routes, the interference graph comprising vertices and interference edges, each of the vertices representing one of the logical nets for which a route was generated, each of the interference edges connecting two vertices that represent a corresponding two logical nets that have corresponding routes that share at least one port of a switch of the switches;
splitting a first route of the routes into route segments based on determining that a number of the interference edges associated with a first vertex of the vertices is less than a number of identifications, wherein the first route is associated with the first vertex; and
assigning the identifications to the routes comprising performing vertex coloring of the vertices of the interference graph, the identifications corresponding to values assigned to the vertices by the vertex coloring, wherein data streams are transmitted along the routes based on the identifications, and wherein a first one of the identifications assigned to the first route includes nested identifications associated with the route segments.

10. The method of claim 9, wherein constructing the interference graph and assigning the identifications to the routes comprising performing vertex coloring further comprises:
iteratively, until the interference graph is empty:
constructing the interference graph;
iteratively, while the interference graph includes a vertex having a number of interference edges incident on the vertex that is less than a number of available identifications, pushing the vertex to a stack and removing the pushed vertex and the interference edges incident on the pushed vertex from the interference graph; and
if the interference graph is not empty, splitting a route of a logical net that corresponds to a vertex remaining in the interference graph into route segments; and
iteratively, until the stack is empty, popping a popped vertex from the stack and assigning the popped vertex a lowest value that does not equal a value assigned to any vertex that is connected to the popped vertex by an interference edge in the interference graph.

11. The method of claim 10, wherein constructing the interference graph and assigning the identifications to the routes comprising performing vertex coloring further comprises:
for each route that was split, nesting identifications of respective route segments in order of the respective route segments along the respective route that was split.

12. The method of claim 10, wherein splitting a route of a logical net into route segments comprises:
inserting between consecutive route segments an engine configured to insert into a data message an identification for the following route segment.

13. The method of claim 9, wherein assigning the identifications to the routes comprising performing vertex coloring further comprises:
pushing the vertices of the interference graph to a stack; and iteratively, until the stack is empty, popping a vertex from the stack and assigning the vertex a lowest value that does not equal a value assigned to any vertex that is connected to the vertex by an interference edge in the interference graph.

14. The method of claim 9, wherein the routes are packet-switched routes, and each of the identifications is a packet identification in a packet header of one of the data streams to be transmitted along a respective packet-switched route.

15. The method of claim 9 further comprising, using the processor-based system:
mapping the kernels of the application to cores of of the DPEs in a DPE array, wherein the switches are stream switches and each of the DPEs in the DPE array further including a stream switch of the stream switches that is connected to form at least part of the routing network, at least some of the routes being to, from, or between cores on which kernels are mapped.

16. A design system comprising:
a processor; and
a memory coupled to the processor, the memory storing instruction code, the processor being configured to execute the instruction code to:
iteratively, until an interference graph is empty:
construct the interference graph based on logical nets and routes of the logical nets through switches of digital processing engines (DPEs) in a routing network, wherein the kernels are mapped to the DPEs and each of the logical nets is formed between two kernels of kernels of an application, the interference graph comprising vertices and interference edges, each of the vertices representing one of the logical nets that has a route, each of the interference edges connecting two vertices that represent a corresponding two logical nets that have corresponding routes that share at least one port of a switch of the switches;
iteratively, while the interference graph includes a vertex having a number of interference edges incident on the vertex that is less than a number of available identifications, push the vertex to a stack and remove the pushed vertex and the interference edges incident on the pushed vertex from the interference graph; and
if the interference graph is not empty and based on determining that the number of interference edges incident on the vertex is less than the number of available identifications, split a route of a logical net that corresponds to a vertex remaining in the interference graph into route segments; and
iteratively, until the stack is empty, pop a popped vertex from the stack and assign the popped vertex a lowest value that does not equal a value assigned to any vertex that is connected to the popped vertex by an interference edge in the interference graph, values assigned to the vertices corresponding to identifications of the routes, wherein data streams are transmitted along the routes based on the identifications, and wherein one of the identifications assigned to the split route includes nested identifications associated with the route segments.

17. The design system of claim 16, wherein the processor is further configured to execute the instruction code to:
for each route that was split, nest identifications of respective route segments in order of the respective route segments along the respective route that was split.

18. The design system of claim 16, wherein the processor being configured to execute the instruction code to split a route of a logical net into route segments is further configured to execute the instruction code to:
insert between consecutive route segments an engine configured to insert into a data message an identification for the following route segment.

19. The design system of claim 16, wherein the processor is further configured to execute the instruction code to:
map the kernels of the application to cores of the DPEs in a DPE array, wherein the switches are stream switches, and each of the DPEs in the DPE array further including a stream switch of the stream switches that is connected to form at least part of the routing network; and
generating the routes of the logical nets through the stream switches of the routing network, at least some of the routes being to, from, or between cores on which kernels are mapped.

20. The design system of claim 16, wherein the routes are packet-switched routes, and each of the identifications is a packet identification in a packet header of one of the data streams to be transmitted along a respective packet-switched route.

* * * * *